United States Patent
Duggal et al.

(10) Patent No.: US 7,198,533 B2
(45) Date of Patent: Apr. 3, 2007

(54) METHOD FOR MAKING AN OLED DEVICE

(75) Inventors: Anil Raj Duggal, Niskayuna, NY (US); Joseph Darryl Michael, Schoharie, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 10/889,498

(22) Filed: Jul. 10, 2004

(65) Prior Publication Data
US 2004/0251818 A1 Dec. 16, 2004

Related U.S. Application Data

(60) Division of application No. 09/712,474, filed on Nov. 14, 2000, now Pat. No. 6,800,999, which is a continuation-in-part of application No. 09/469,702, filed on Dec. 22, 1999, now Pat. No. 6,566,808.

(60) Provisional application No. 60/194,068, filed on Mar. 31, 2000, provisional application No. 60/178,451, filed on Jan. 27, 2000.

(51) Int. Cl.
*H01J 9/00* (2006.01)
(52) U.S. Cl. ....................................................... 445/24
(58) Field of Classification Search ............ 445/23–25; 313/500–512
See application file for complete search history.

(56) References Cited

U.S. PATENT DOCUMENTS

| | | | |
|---|---|---|---|
| 3,763,468 A | 10/1973 | Ovshinsky et al. | |
| 4,186,020 A | 1/1980 | Wachtel | |
| 4,190,788 A | 2/1980 | Yoshikawa et al. | |
| 5,247,190 A | 9/1993 | Friend et al. | |
| 5,294,870 A | 3/1994 | Tang et al. | |
| 5,661,645 A | 8/1997 | Hochstein | |
| 5,705,285 A | 1/1998 | Shi et al. | |
| 5,708,130 A | 1/1998 | Woo et al. | |
| 5,783,108 A | 7/1998 | MacKay | |
| 5,828,181 A | 10/1998 | Okuda | |
| 5,908,495 A | 6/1999 | Nohr et al. | |
| 5,965,242 A | 10/1999 | Patton et al. | |
| 6,072,280 A | 6/2000 | Alen | |
| 6,259,838 B1 | 7/2001 | Singh et al. | |
| 6,337,492 B1* | 1/2002 | Jones et al. ................... 257/40 |
| 6,370,019 B1 | 4/2002 | Matthies et al. | |
| 6,461,885 B1* | 10/2002 | Lupo et al. ................... 438/29 |
| 6,566,808 B1 | 5/2003 | Duggal et al. | |

FOREIGN PATENT DOCUMENTS

| | | |
|---|---|---|
| EP | 0273997 | 7/1988 |
| EP | 0936682 | 8/1999 |
| JP | 11087055 | 11/1997 |
| WO | 9738347 | 10/1997 |
| WO | 9828946 | 7/1998 |

OTHER PUBLICATIONS

R. H. Friend, 4 Journal of Molecular Electronics, 37-46 (1988), no month.

(Continued)

*Primary Examiner*—Joseph Williams
(74) *Attorney, Agent, or Firm*—Mary Louise Gioeni; William E. Powell, III

(57) ABSTRACT

An AC powered light emitting device is provided. The device includes a plurality of organic light emitting diode (OLED) modules. The modules are arranged into groups of modules where the individual modules of the groups are electrically connected in series. The device may be powered using AC power. A display is also provided. The display includes a plurality of OLED modules arranged to spell out a letter or depict an image.

19 Claims, 17 Drawing Sheets

OTHER PUBLICATIONS

Gerrit Klarner et al., "Cp;prfast B;ie :ogjt Emitting Random Copolymers Derived from Di-N-hexylflouroene and Anthracene", 10 Adv. Mater, 993-997 (1998), no month.

Junji Kido et al., "Organic Electroluminescent Devices Based On Molecularly Doped Polymers", 61 Appl. Phys. Lett., 761-763 (1992), no month.

Chung-Chih Wu et al., "Efficient Organic Electroluminescent Devices Using Single-Layer Doped Polymer Thin Films with Bipolar Carrier Transport Abilities", 44 IEEE Trans. on Elect. Devices, 1269-1281 (1997), no month.

A.W. Grice et al., "High Brightness & Efficiency of Blue Light-Emitting polymers Diodes", 73 Appl. Phys. Letters, 629-631 (1998), no month.

Hiroyuki Suzuki et al., "Near-ultraviolet Electroluminescence from polysilanes", 331 Thin Solid Films, 64-70 (1998), no month.

* cited by examiner

METHOD FOR MAKING AN OLED DEVICE

This application claims the benefit of U.S. Provisional Application No. 60/194,068, filed Mar. 31, 2000, and of U.S. Provisional Application No. 60/178,451, filed Jan. 27, 2000, the disclosures of which is hereby incorporated by reference in its entirety. This application is a division of application Ser. No. 09/712,474, filed Nov. 14, 2000, now U.S. Pat. No. 6,800,999, which is a continuation-in-part of U.S. application Ser. No. 09/469,702, filed on Dec. 22, 1999, now U.S. Pat. No. 6,566,808.

BACKGROUND OF THE INVENTION

The present invention relates generally to AC powered light devices, and more particularly to an AC powered organic light emitting diode (OLED) device.

Organic electroluminescent devices, such as organic light emitting diodes (OLEDs), are currently used for display applications and are planned for use in general lighting applications. An OLED device includes one or more organic light emitting layers disposed between two electrodes, e.g., a cathode and a light transmissive anode, formed on a light transmissive substrate. The organic light emitting layer emits light upon application of a voltage across the anode and cathode. Upon the application of a voltage from a voltage source, electrons are directly injected into the organic layer from the cathode, and holes are directly injected into the organic layer from the anode. The electrons and the holes travel through the organic layer until they recombine at a luminescent center. This recombination process results in the emission of a photon, i.e., light.

Large area OLED devices typically combine many individual OLED devices on a single substrate or a combination of substrates with multiple individual OLED devices on each substrate. Applications for large area OLED devices include lighting. For most of these applications, alternating current (AC) power is most readily available. However, OLEDs have rectifying current/voltage characteristics and so are typically operated with direct current (DC) power wired with the correct polarity for light emission. In these applications, AC power is converted to DC power to operate the large area OLEDs.

In many signage applications, the sign or display system comprises a light source, and a covering sheet overlying the light source to define the image or lettering desired. The covering sheet is partly opaque and partly transparent. Light from the light source is transmitted through the transparent regions of the covering sheet but not through the opaque regions. Thus, typically, a covering sheet is required to define the image or lettering desired.

BRIEF SUMMARY OF THE INVENTION

It would be an advantage to provide an OLED system, such as a large area OLED, where the individual OLED devices of an array of OLED devices could be powered directly by AC power. Such a system does not require AC to DC power conversion and conditioning, and thus lowers the cost for the OLED system.

It would also be an advantage to provide an OLED system, such as a large area OLED, that did not require a covering sheet to define an image or lettering, and that required only a number of individual OLED devices to define the image or lettering.

In accordance with one aspect of the present invention, there is provided a light emitting device comprising at least one OLED module, and an AC power source electrically connected to and providing an AC voltage to the at least one OLED module.

In accordance with another aspect of the present invention, there is provided a light emitting device comprising a plurality of organic light emitting diode (OLED) modules electrically connected in series, and an alternating current (AC) power source electrically connected to and providing an AC voltage to the plurality of OLED modules.

In accordance with another aspect of the present invention, there is provided a method of operating the light emitting devices described above, the method comprising providing an AC square waveform voltage to the first and second conducting layers.

In accordance with another aspect of the present invention, there is provided a method of making a light emitting device comprising providing a substrate, forming a plurality of OLED series groups on the substrate, each OLED series group comprising a plurality of OLED modules, the OLED modules of each OLED series group electrically connected in series, wherein the OLED modules may emit light upon application of an AC voltage.

In accordance with another aspect of the present invention, there is provided a method of making a light emitting device comprising providing a substrate, forming a first conducting material over the substrate, forming an organic light emitting material over at least part of the first electrode material, forming a second conducting material over at least part of the organic light emitting material, and patterning the first conducting material, organic light emitting material, and second conducting material to form a plurality of organic light emitting diode (OLED) modules, each OLED module having a first electrode formed from the patterned first conducting material, a light emitting layer formed from the organic light emitting material, and a second electrode formed from the patterned second conducting material, the first and second electrodes of respective OLED modules electrically connected to electrically connect the OLED modules in series.

In accordance with another aspect of the present invention, there is provided a display comprising a plurality of OLED modules arranged to spell out a letter or depict an image.

In accordance with another aspect of the present invention, there is provided a method of making a display comprising providing a substrate, and arranging a plurality of OLED modules to spell out a letter or depict an image.

BRIEF DESCRIPTION OF THE DRAWINGS

Other features and advantages of the invention will be apparent from the following detailed description of preferred embodiments and the accompanying drawings, in which.

DETAILED DESCRIPTION OF THE PREFERRED EMBODIMENTS OF THE INVENTION

Figure 1:
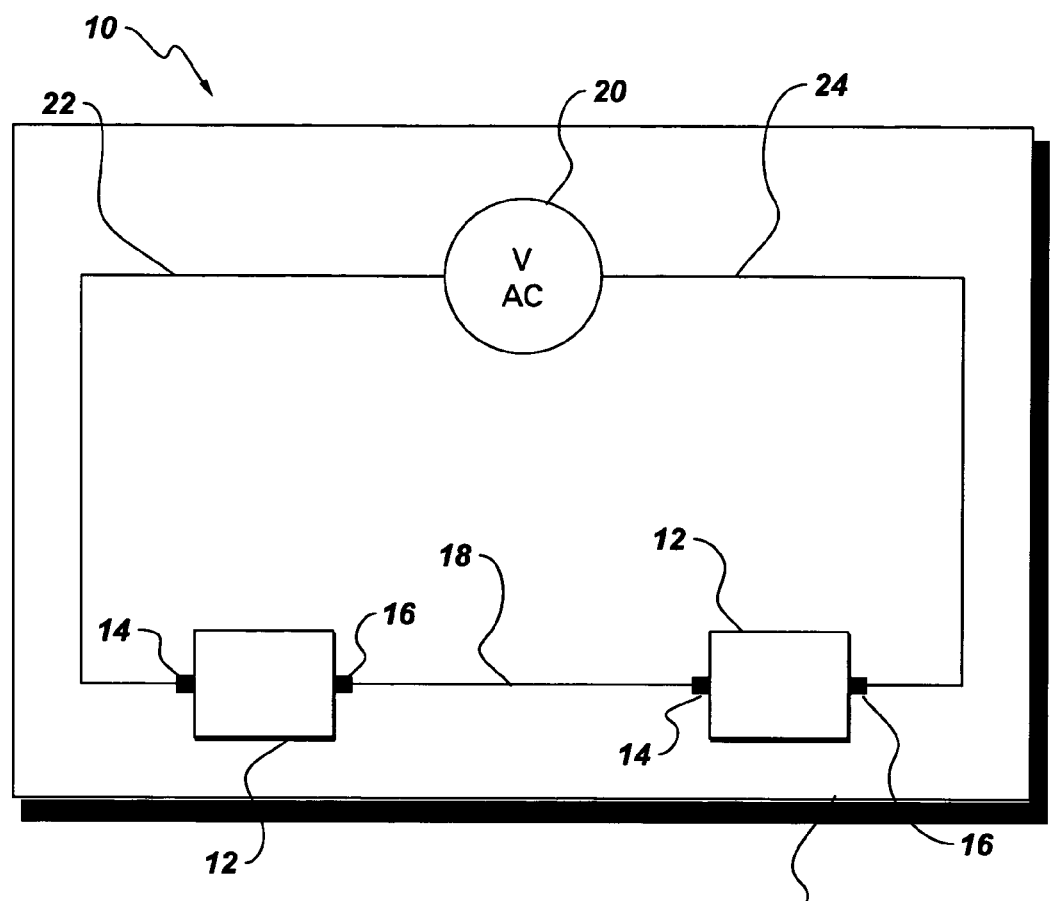
FIG. 1 is a drawing of a light emitting device according to a first embodiment of the invention.

FIG. 1 illustrates a light emitting device according to a first embodiment of the present invention. The light emitting device 10 of FIG. 1 includes a plurality of OLED modules 12. FIG. 1 illustrates two OLED modules 12. However, the number of OLED modules may be more than two. The OLED modules are arranged such that they are connected in series with one another.

Each of the individual OLED modules 12 has an anode 14 and a cathode 16. The OLED modules 12 are electrically connected in a series arrangement, anode 14 to cathode 16, as shown in FIG. 1. In this regard, the respective anodes and cathodes may be electrically connected via interconnect wiring 18 as shown in FIG. 1.

The light emitting device 10 also includes an AC power source 20 to provide an AC voltage to the OLED modules. The AC power source 20 may provide power to the plurality of OLED modules 12 via first conducting line 22 and second conducting line 24. The conducting lines 22 and 24, are electrically connected to a respective end anode and end cathode of the plurality of OLED modules 12.

The OLED modules 12 connected in series will include two end modules which are electrically connected to only one other module. In this case, the conducting lines 22 and 24 are respectively connected with the anode and cathode of the respective end modules. Thus, the AC power source 20 provides an AC voltage to each of the OLED modules 12 of the plurality of OLED modules.

The AC power source 20 and the plurality of OLED modules 12 are shown in FIG. 1 as arranged on a substrate 26. However, the plurality of OLED modules 12 and the AC power source 20 need not be arranged on a single substrate. In fact, neither the plurality of OLED modules 12 or the AC power source 20 need be arranged on a substrate.

FIG. 1 shows a light emitting device 10 with only a single group of OLED modules 12 arranged in a series configuration. However, the first embodiment of the present invention is not so limited. The light emitting device 10 of the first embodiment may comprise more than one group of OLED modules, the modules of each group arranged in a series configuration. In this case, the groups may be electrically connected with each other in a parallel configuration.

Figure 2:
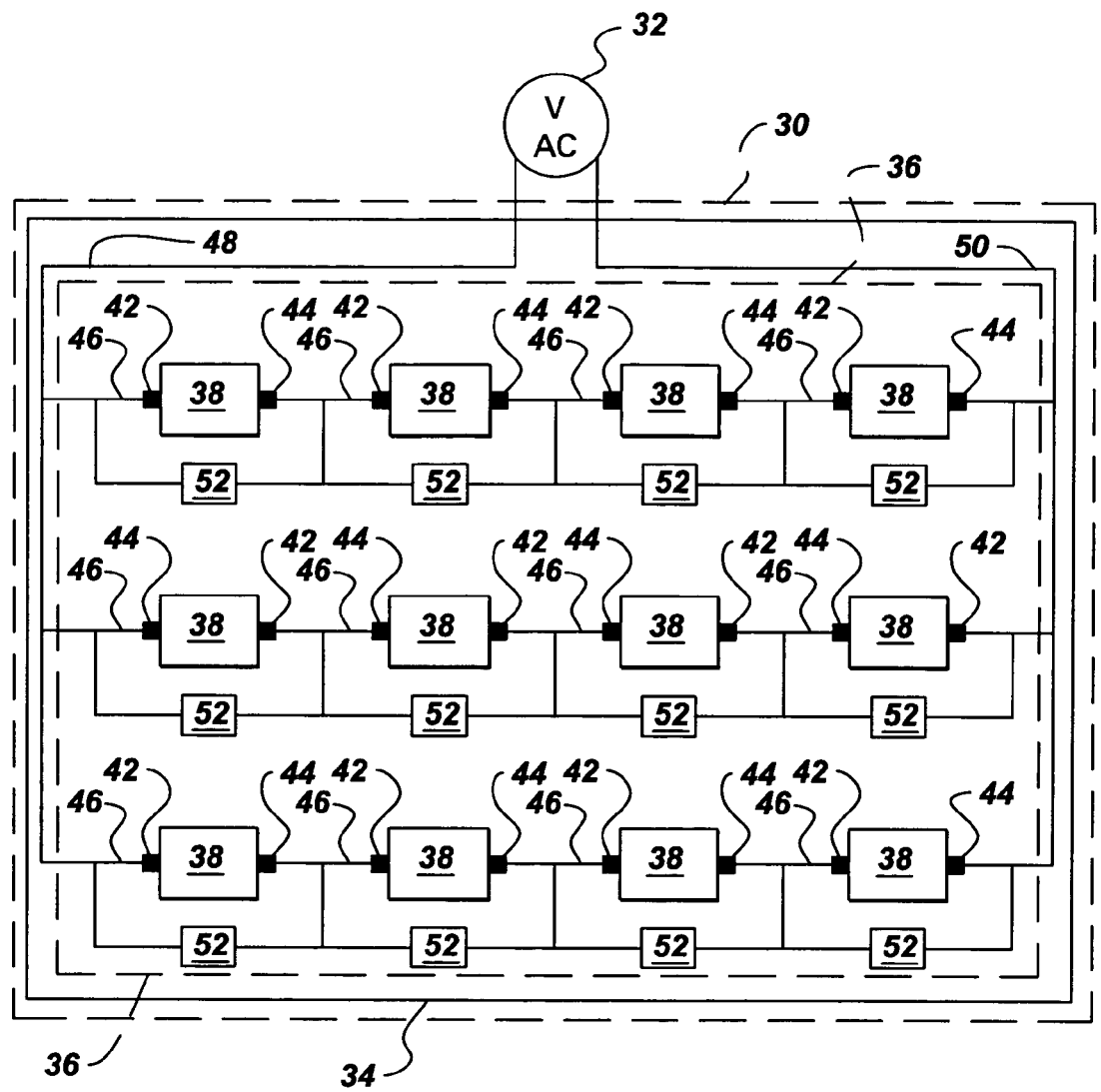
FIG. 2 is a drawing of a light emitting device according to a second embodiment of the invention.

FIG. 2 illustrates a second embodiment of the present invention. The light emitting device 30 of the second embodiment is seen connected to an AC power source 32. The light emitting device 30 includes a substrate 34 and a plurality of OLED series groups 36 provided on the substrate 34. The substrate may be, for example, a transparent glass substrate.

Each of the OLED series groups 36 comprise a plurality of individual OLED modules 38. The OLED modules 38 of a particular series group are electrically connected in series, i.e., anode to cathode. When an AC voltage is provided from the AC power source 32 to the OLED modules 38, the OLED modules 38 emit light.

As with the first embodiment, each of the OLED modules 38 in the second embodiment includes a respective anode 42 and cathode 44. The OLED modules 38 in a particular series group 36 are electrically connected in a series arrangement, respective anode to respective cathode as shown in FIG. 2.

FIG. 2 shows that adjacent OLED modules 38 in a particular series group 36 are connected anode to cathode. However, it is not required that adjacent OLED modules 38 in a particular series group 36 be so connected. Instead, a particular OLED module 38 in a particular series group 36 may be connected to another OLED module 38, where that other OLED module is not immediately adjacent or the closest OLED module to the particular module. However, in any case, all the OLED modules in a particular series group are electrically connected in series.

As with the first embodiment, in the second embodiment the respective anodes and cathodes of the OLED modules 38 electrically connected in series may be connected via interconnect wiring 46.

AC power is provided to the series groups 36 and thus the individual OLED modules 38 from the AC power source 32 via first conducting line 48 and second conducting line 50. The first conducting line 48 is electrically connected to a first end of each OLED series group 36. The second conducting line 50 is electrically connected to a second end of each OLED series group 36 opposite the first end. The first and second ends are opposite to each other in the sense of having opposite polarity, i.e., one of the ends is electrically connected to a cathode and the other to an anode. The first and second ends need not be opposite to each other in a spatial sense, i.e., the first and second ends need not correspond to the OLED modules 38 which are physically the furthest apart.

FIG. 2 shows the AC power source 32 as being separate from the light emitting device 30. Alternatively, the AC power source 32 may be included in the light emitting device 30.

Optionally, the light emitting device may include a plurality of circuit elements 52, where each circuit element 52 is electrically connected in parallel with a respective OLED module 38. In this case, each OLED module may not have a corresponding circuit element 52. However, if the light emitting device 30 includes circuit elements 52, at least some of the OLED modules 38 will have a corresponding circuit element 52.

FIG. 2 shows each of the circuit elements 52 in parallel with a single OLED module 38. Alternatively, a particular circuit element may be in parallel with more than OLED module.

The circuit elements 52 may comprise resistors, diodes, varistors or a combination thereof. A circuit element 52 may function to modify the voltage across its respective OLED module 38. In this case the circuit element may, for example, reduce the voltage across its respective OLED module 38 to provide a proper operating voltage for the OLED module.

The circuit element 52 may also or alternatively function to provide fault tolerance for its respective OLED module. For example, to provide fault tolerance for an OLED module failing open, it is preferred that the circuit element 52 be a varistor or a diode. Less preferred for fault tolerance, the circuit element may be a resistor.

It is preferred that the series groups 36 of the light emitting device 30 be arranged such that the ends of the series groups which are connected to the first conducting line 48 have alternating polarity as shown in FIG. 2. In other words, if the first conducting line 48 is electrically connected to one series group via a cathode of an OLED module 38 of that series group, then the next series group is electrically connected to the first conducting line 48 via an anode of an OLED module 38 of that next series group. Likewise, the second conducting line is connected to series group ends having alternating polarity.

When AC power is provided to the light emitting device 30, and the series groups are arranged to be connected with alternating polarity, the fraction of the series groups connected with one polarity will emit light during one half-cycle of the AC waveform. During the other half-cycle, the remaining series groups connected with the opposite polarity will emit light. Thus, the light, being emitted during both half-cycles of the AC waveform will have temporal uniformity.

If it is desired that the light emitted during both half cycles be of the same overall intensity, then one-half of the OLED modules 38 of the series groups should be connected with one polarity and one-half with the other polarity. Of course, if an application does not require that the light emitted during alternating half-cycles have a uniform temporal intensity, then the fraction of OLED modules connected with one polarity need not be the same as the fraction connected with the opposite polarity. Indeed, all of the OLED modules may be connected with the same polarity.

FIG. 2 illustrates series groups that are immediately adjacent to one another are connected to have opposite polarity. This arrangement is preferred if it is desired that the light emitting device emit light with a uniform spatial intensity. However, the series groups need not be arranged such that immediately adjacent series groups have opposite polarity.

FIG. 2 illustrates each of the series groups 36 comprising a row of OLED modules 38 where the OLED modules in the group are arranged in a straight line. However, the series groups 36 may comprise a group of OLED modules 38 arranged in a configuration other than a straight line. For example, the group of OLED modules 38 corresponding to a particular series groups 36 may be arranged in more than one straight line of OLED modules, or may include only a fraction of the OLED modules in a particular line.

FIG. 2 illustrates each of the series groups 36 having four OLED modules 38. However, the number of OLED modules 38 may be more or less than four. The number of OLED modules 38 will depend upon the maximum desired voltage for an OLED module, and upon the maximum voltage provided by the AC power source at the peak of the AC voltage waveform used in operation. For example, if a 120V AC source is employed and each OLED module 38 has an identical current/voltage characteristic with a maximum desired voltage of 10V, then twelve OLED modules would be connected in series. Alternatively, if circuit elements (not shown) are employed to reduce the voltage to respective OLED modules by one-third, eight OLED modules would be employed in each series group. In this case the circuit elements would be in series with the OLED modules. For example, resistors may be employed between OLED modules in a series group, or the resistors may be at one end or the other of the series group.

Figure 3:
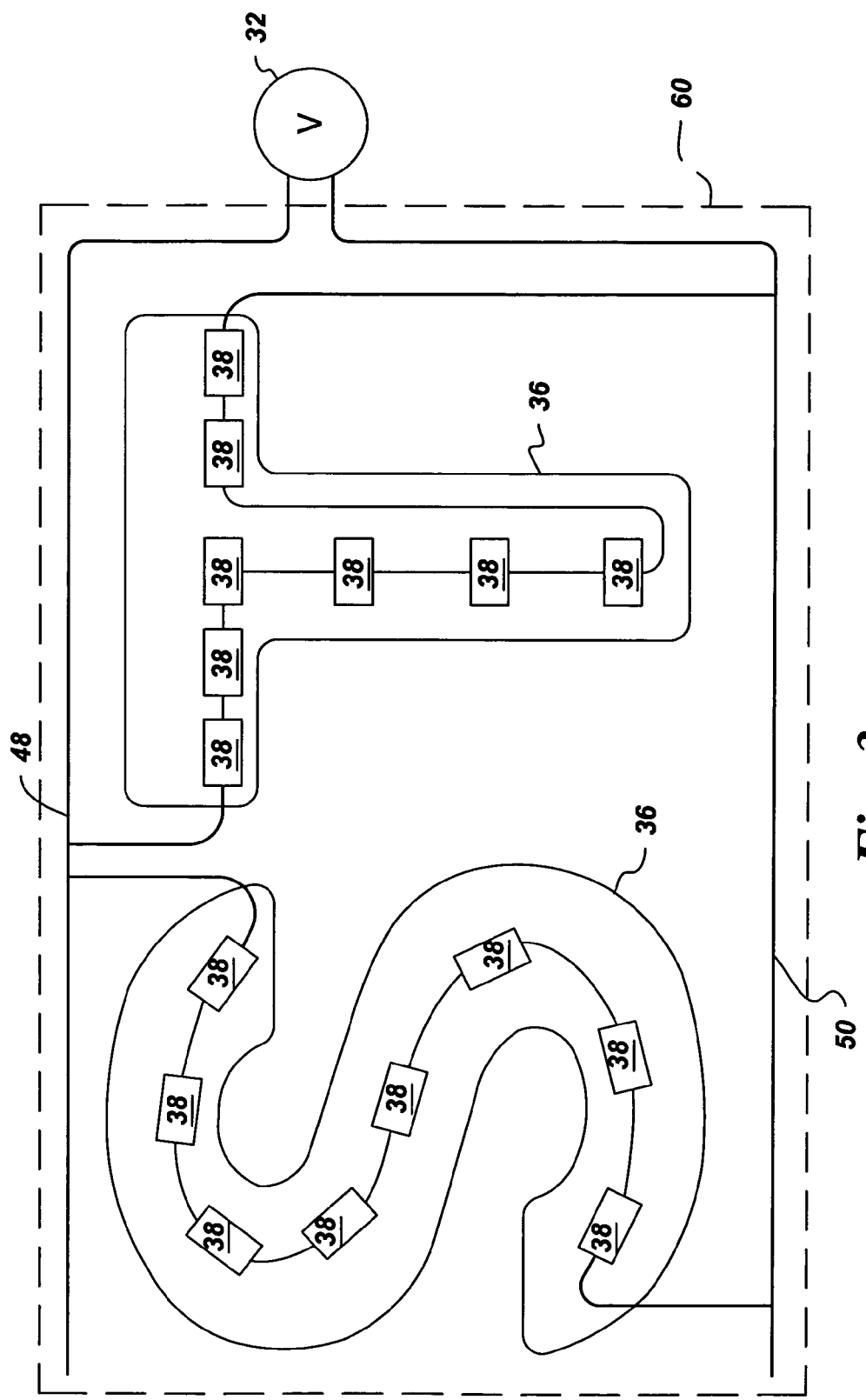
FIG. 3 is a drawing of a light emitting device according to another embodiment of the invention.

FIG. 3 illustrates an embodiment of the invention where the OLED modules of a particular series group of a light emitting device are arranged as part of a sign to spell out a word or depict an image. As with the second embodiment, in the embodiment of FIG. 3, the light emitting device 60 comprises a plurality of series groups 36, each series group comprising a plurality of OLED modules 38. Also, as with the second embodiment, in the embodiment of FIG. 3A, the OLED modules 38, each having an anode (not shown) and cathode (not shown), of a particular series group are electrically connected in series, i.e., anode to cathode. When an AC voltage is provided from the AC power source 32 to the OLED modules 38, the OLED modules emit light.

AC power is provided to the series groups 36 and thus the individual OLED modules 38 from an AC power source 32 (either separate from or part of the light emitting device 60). The AC power is provided via first conducting line 48 and second conducting line 50. The first conducting line 48 is electrically connected to a first end of each OLED series group 36. The second conducting line 50 is electrically connected to a second end of each OLED series group 36 opposite the first end.

The OLED modules 38 collectively spell out the letters "S" and "T" in FIG. 3. Of course the modules can be arranged to spell out any text or depict any images desired. Individual letters may be spelled out using more than one series group 36, or all or part of a single series group 36. A single series group 36 may also spell out part of more than one letter.

FIG. 3 illustrates the OLED modules arranged to spell out letters or depict images where the OLED modules are arranged in groups of series connected modules. Alternatively, in the embodiment of FIG. 3, the OLED modules need not be arranged in groups of series connected modules, but may be connected in parallel with each other. In this case a DC power source instead of an AC power source may be used to provide voltage to the modules.

The embodiment of FIG. 3, whether powered by a DC power source or an AC power source, provides an advantage over display or sign systems that comprise a light source and a covering sheet to block some of the light from the source to depict an image. In the embodiment of FIG. 3, no covering sheet is required. Furthermore, the system of FIG. 3 need include only the number of modules necessary to depict an image, and not a full array. Thus, a significant cost saving is achieved.

Figure 4:
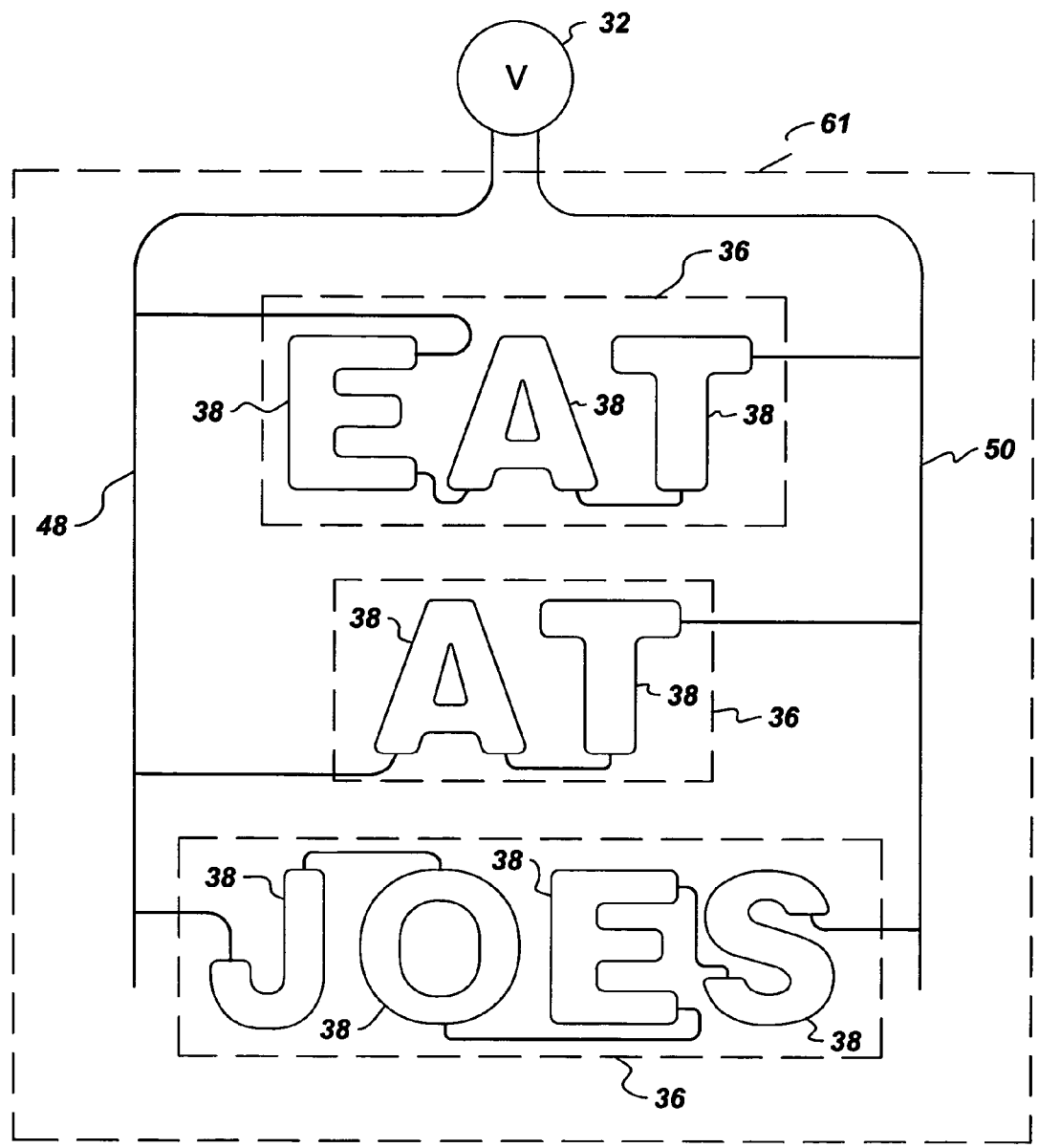
FIG. 4 is a drawing of a light emitting device according to another embodiment of the invention.

FIG. 4 shows another embodiment of the invention similar to that of FIG. 3. However in the embodiment of FIG. 4, a single OLED module may be shaped like a letter or a desired image. As with the embodiment of FIG. 3, the light emitting device 61 of the embodiment of FIG. 4 comprises a plurality of series groups 36, each series group comprising a plurality of OLED- modules 38. However in the embodiment of FIG. 4, each of the OLED modules is shaped like a letter or image. In the embodiment of FIG. 4, the OLED modules 38, each having an anode (not shown) and cathode (not shown), of a particular series group are electrically connected in series, i.e., anode to cathode. When an AC voltage is provided from the AC power source 32 to the OLED modules 38, the OLED modules emit light.

AC power is provided to the series groups 36 and thus the individual OLED modules 38 from an AC power source 32 (either separate from or part of the light emitting device). The AC power is provided via first conducting line 48 and second conducting line 50. The first conducting line 48 is electrically connected to a first end of each OLED series group 36. The second conducting line 50 is electrically connected to a second end of each OLED series group 36 opposite the first end.

The three OLED series groups in FIG. 4, respectively spell out the words "EAT", "AT", and "JOES". Of course the modules can be arranged to spell out any text or depict any images desired.

FIG. 4 illustrates the OLED modules arranged to spell out letters or depict images where the OLED modules are arranged in groups of series connected modules. Alternatively, in the embodiment of FIG. 4, the OLED modules need not be arranged in groups of series connected modules, but may be connected in parallel with each other. In this case a DC power source instead of an AC power source may be used to provide voltage to the modules.

Figure 5:
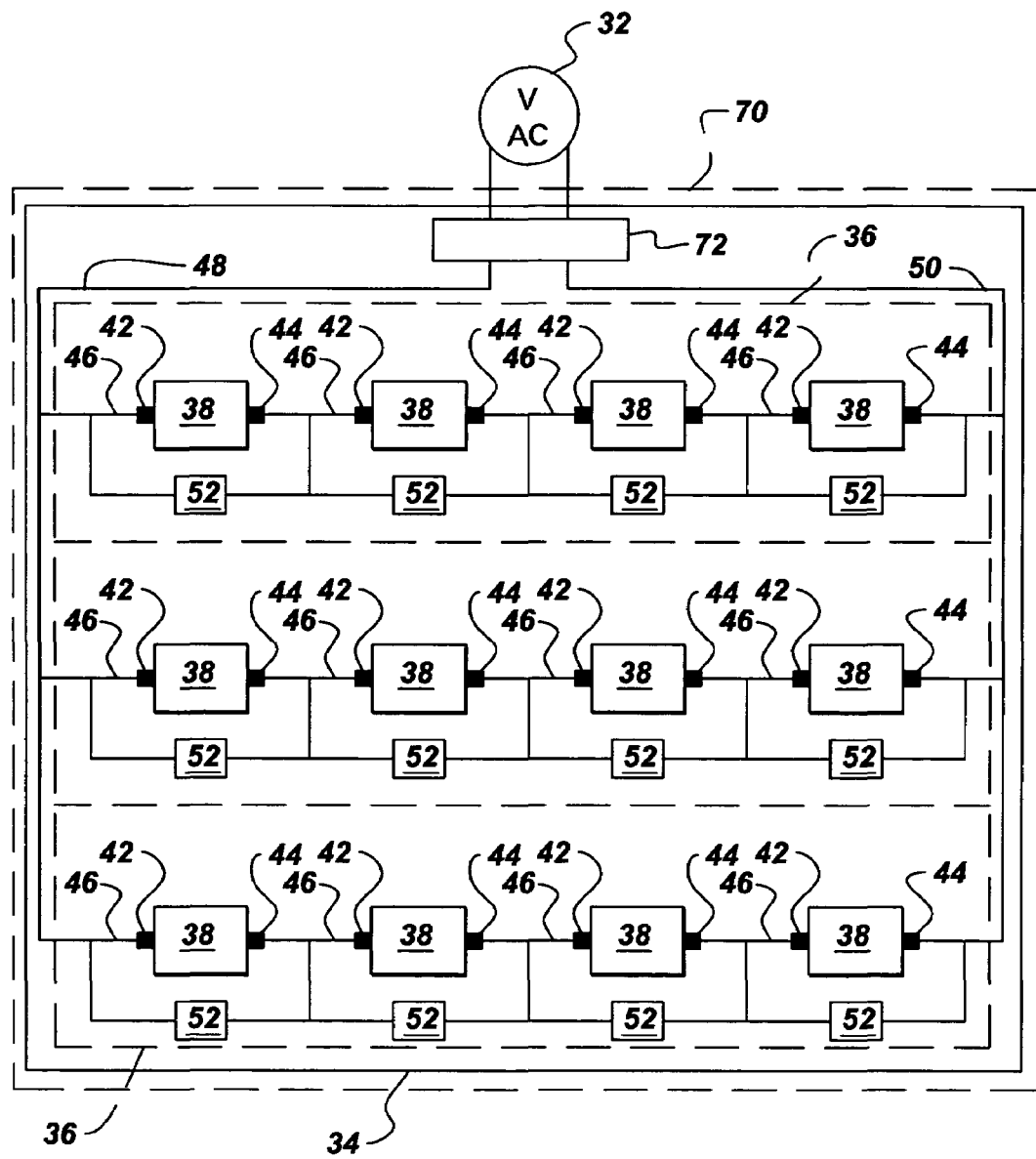
FIG. 5 is a drawing of a light emitting device according to another embodiment of the invention.

FIG. 5 shows another embodiment of the invention. The embodiment of FIG. 5 is the same as that of the second embodiment, except that the light emitting device 70 of FIG. 5 includes a converting circuit 72. Thus, the portion of the description of the embodiment of FIG. 5 that is the same as that of the second embodiment is omitted here for the sake of brevity.

Figure 6:
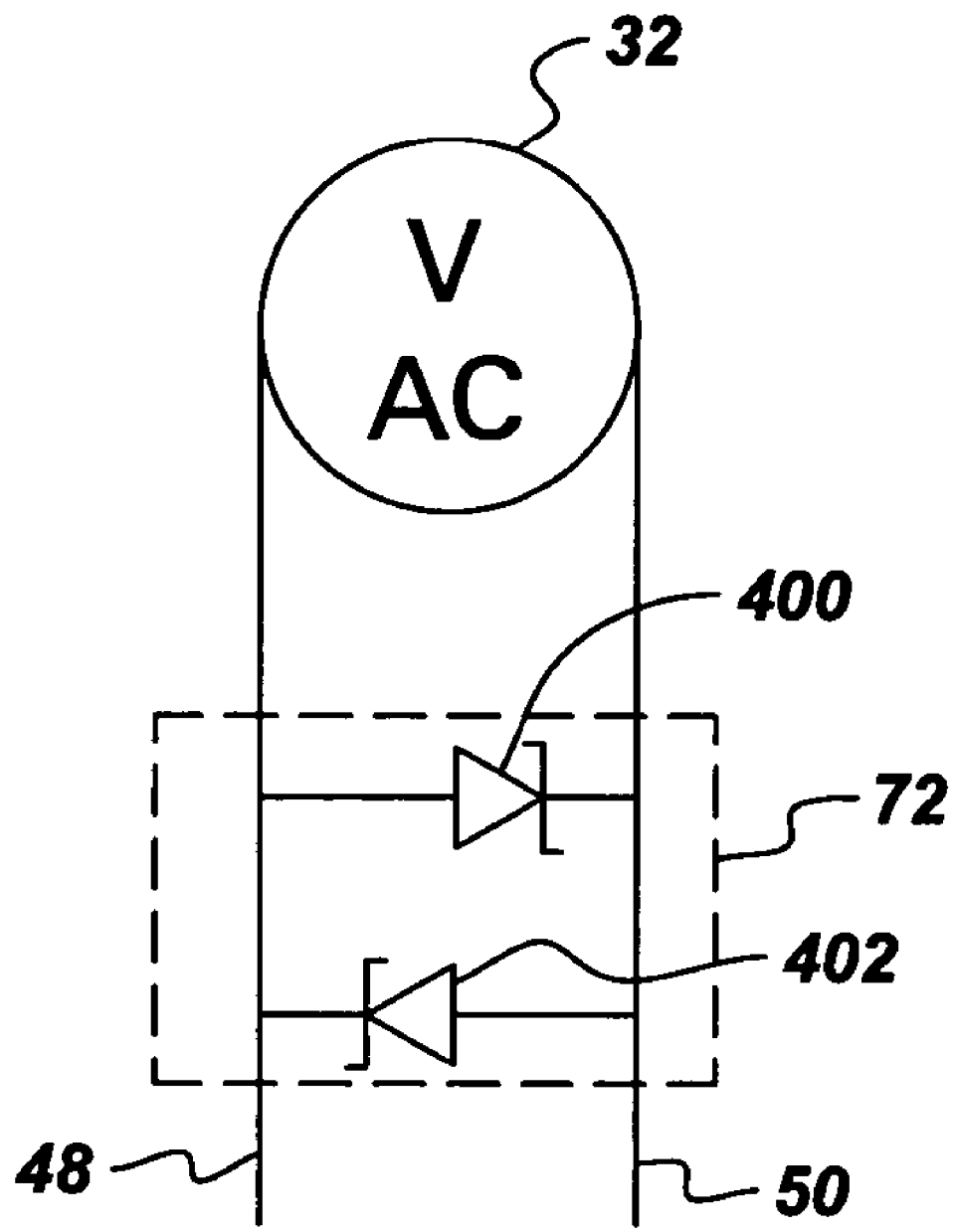
FIG. 6 is a drawing including a converting circuit for use with the embodiment of FIG. 5.

The converting circuit 72 is connected to both the AC power source 32, and the first conducting line 48 and second conducting line 50. The converting circuit 72 acts to convert the voltage waveform applied by the AC power source 32 to a converted voltage waveform. The converted voltage waveform is then applied to the series group modules 36. An example of the converting circuit, as shown in FIG. 6, is described below.

Figure 9:
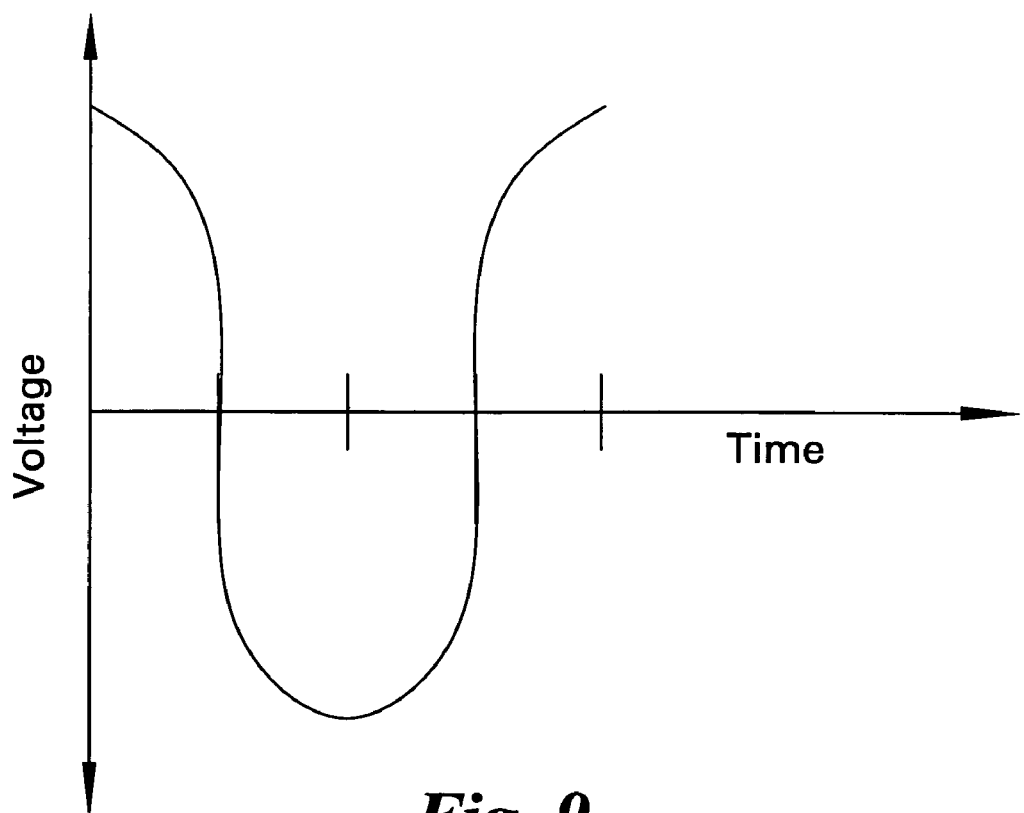
FIGS. 9 and 10 illustrate a sinusoidal voltage waveform output from an AC power source, and a square pulse waveform, respectively.

FIG. 9 shows a sinusoidal voltage waveform output from an AC power source, such as a line voltage. In applications where a square pulse waveform is desired, the converting circuit acts to convert the sinusoidal voltage waveform to a square pulse waveform, such as the one shown in FIG. 10. A square pulse waveform may be desirable for applications where the OLED modules 38 operate at their highest efficiency at a particular voltage. The voltage magnitude of the square pulse is set to be at about the highest efficiency voltage in that case. Thus, the converting circuit 72 acts to provide a converted waveform so that the optimum voltage is applied across the OLED modules.

Figure 10:
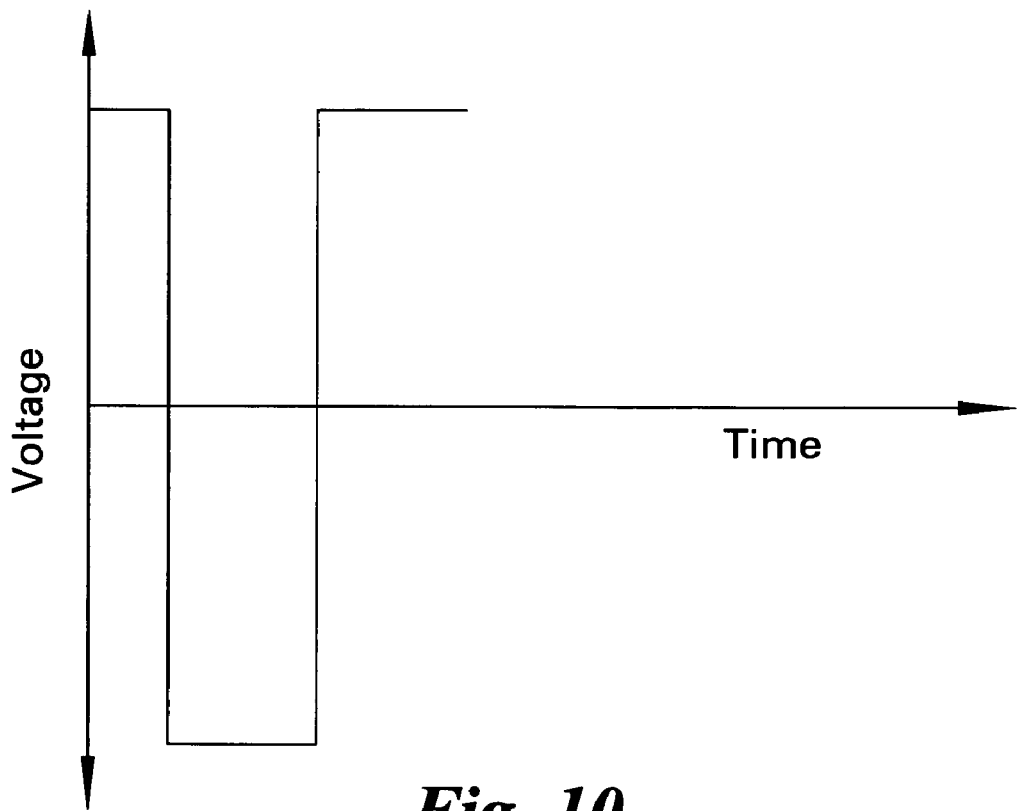

FIG. 10 shows a square wave pulse waveform where the length of time that the voltage is positive is approximately the same as the length of time that the voltage is positive, i.e., the period for positive voltage is the same as the period for negative voltage. However, the waveform may also be such that the length of time that voltage is negative is greater than the length of time that the voltage is positive, or vice versa.

Referring again to FIG. 5, the converting circuit 72 may simply comprise, for example, back-to-back zener diodes. FIG. 6 shows an example of a converting circuit 72 with back-to-back zener diodes, 400 and 402, respectively. The diodes 400 and 402 are connected to the power source 32 with opposite polarity, as can be seen in FIG. 6. The zener diodes are chosen so that the rating clamping voltage provided by the zener diodes would provide a voltage to the OLED modules which is close to the optimum operating voltage. Zener diodes are typically not manufactured with a tight tolerance with regards to clamping voltage. Thus the voltage provided by the converting circuit 72 comprising back-to-back zener diodes would be a "clipped" sine wave waveform (assuming the input waveform is sinusoidal), not a true square wave. However, the "clipped" sine wave should be sufficient in most applications, and a back-to-back zener diode converting circuit would be inexpensive.

The frequency of the voltage waveform output from the zener diode converting circuit 72 would have the same frequency as the input waveform. Alternatively, the converting circuit 72 may be constructed to provide a square wave pulse that can be driven at a significantly higher frequency, i.e., >10 kHz, than cycle frequency input into the circuit. The drive frequency selected would be dictated by the response time of the OLED system.

Figure 7:
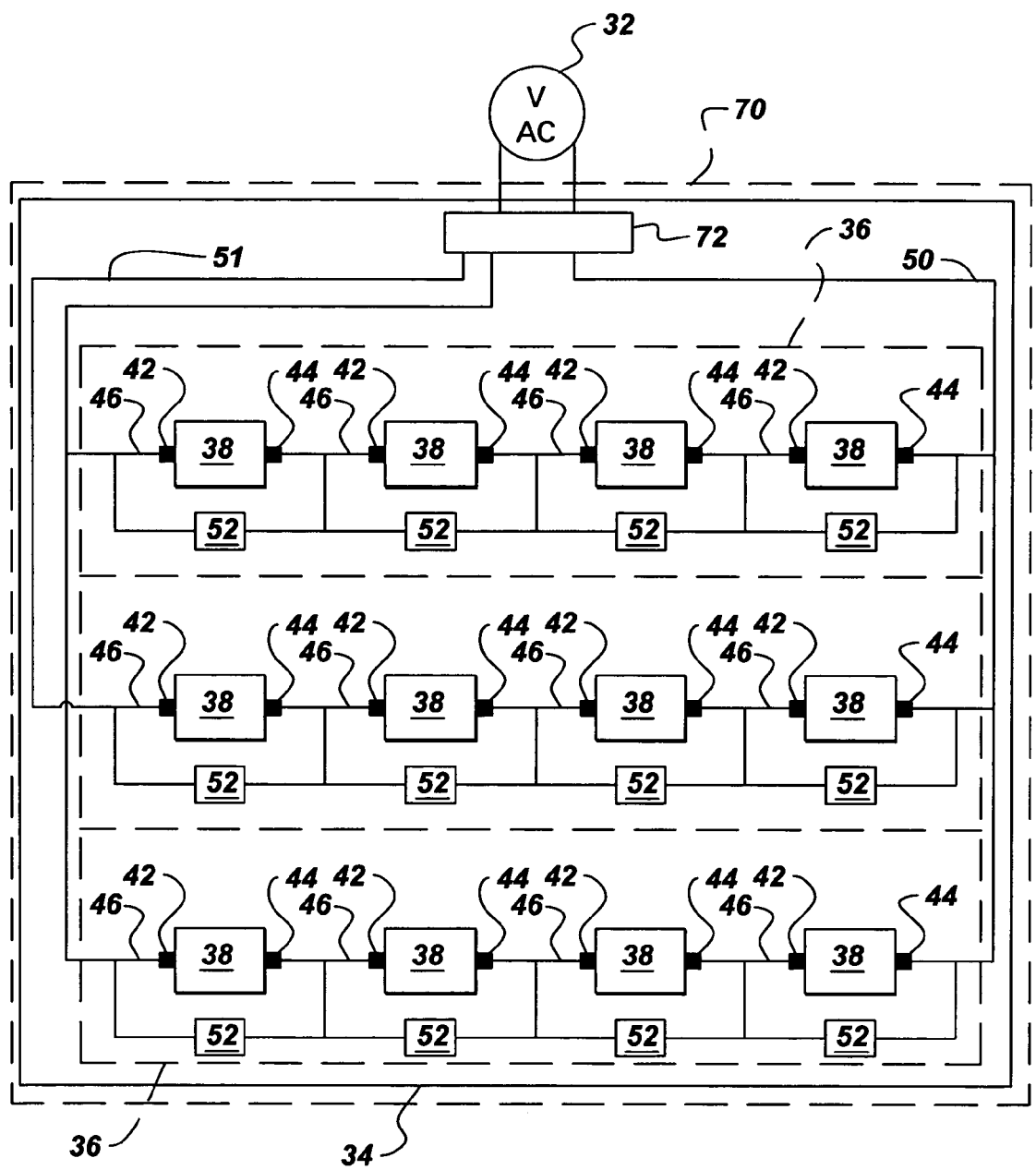
FIG. 7 is a drawing of a light emitting device according to another embodiment of the invention.

FIG. 7 shows another embodiment of the invention. The embodiment of FIG. 7 is the same as that of embodiment of FIG. 5 except that the converting circuit 72 has outputs for three conducting lines, two first conducting lines 48 and 51 and a second conducting line 50. Thus, the portion of the description of the embodiment of FIG. 7 that is the same as that of the embodiment of FIG. 5 is omitted here for the sake of brevity.

Figure 8:
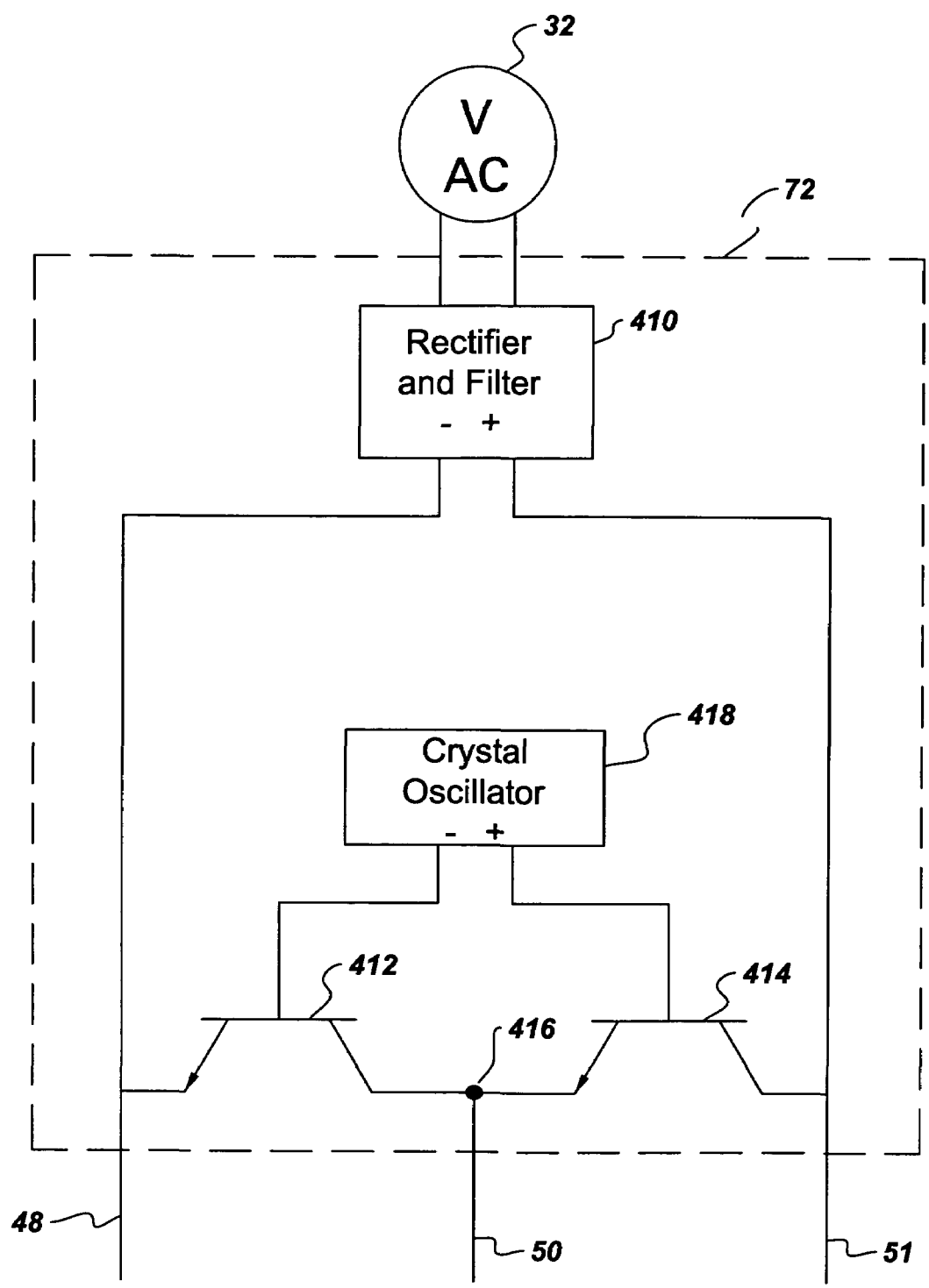
FIG. 8 is a drawing including a converting circuit for use with the embodiment of FIG. 7.

FIG. 8 shows an example of a converting circuit 72 for the light emitting device of FIG. 7. FIG. 8 provides a wave pulse that can be driven at a higher frequency than the cycle frequency input into the circuit. The converting circuit 72 includes a rectifier and filter 410, where the rectifier and filter 410 are connected to an AC power source 32. The circuit also includes two transistors 412 and 414 connected to each other at node 416 as shown in FIG. 7. The transistor 412 is also connected to one terminal of the rectifier and filter 410, while the other transistor 414 is connected to the other terminal of the rectifier and filter 410. The converting circuit also includes a crystal oscillator 418, where one terminal of the crystal oscillator 418 is connected to one transistor 412, and the other terminal of the crystal oscillator 418 is connected to the other transistor 414. The crystal oscillator 418 will determine the driving frequency of the waveform to be input to the OLED modules via the lines 48, 50 and 51.

The transistors of the converting circuit 72 may comprise, for example, field effect transistors (FETS), complementary FETS (i.e. N and P channel FETS together). The use of FETS would allow miniaturization of the light emitting device package. Additionally, the use of complementary FETS would further reduce the package size. With minimal rectification of the input line voltage for cost effectiveness, the square wave pulse would necessarily have a modulation. However, it is believed that this would have an imperceptible effect on the light output.

A method of operating the light emitting device of the present invention is now described. In the simplest form, the light emitting device is operated using an AC voltage waveform which is not transformed prior to being applied to the OLED modules. In this case, a sinusoidal waveform line voltage may be simply applied to one of the light emitting devices described in the first or second embodiment or the embodiments of FIG. 3 or 4, and thus a sinusoidal waveform is applied to the OLED modules.

Alternatively, an AC waveform other than sinusoidal may be applied to one of the light emitting devices as described in the first or second embodiment or the embodiments of FIG. 3 or 4. For example, a square pulse voltage waveform may be applied to one of the light emitting devices described in the first or second embodiment or the embodiments of FIG. 3 or 4, and thus a square pulse voltage waveform is applied to the OLED modules.

As another alternative, a sinusoidal AC waveform may be applied to the light emitting device of FIG. 5 or FIG. 6, and the sinusoidal waveform may then be transformed to another waveform on the light emitting device itself. In this case the device transformed waveform, such as a square pulse waveform, or "clipped" sine wave waveform, may be then be provided to the OLED modules.

Figure 11:
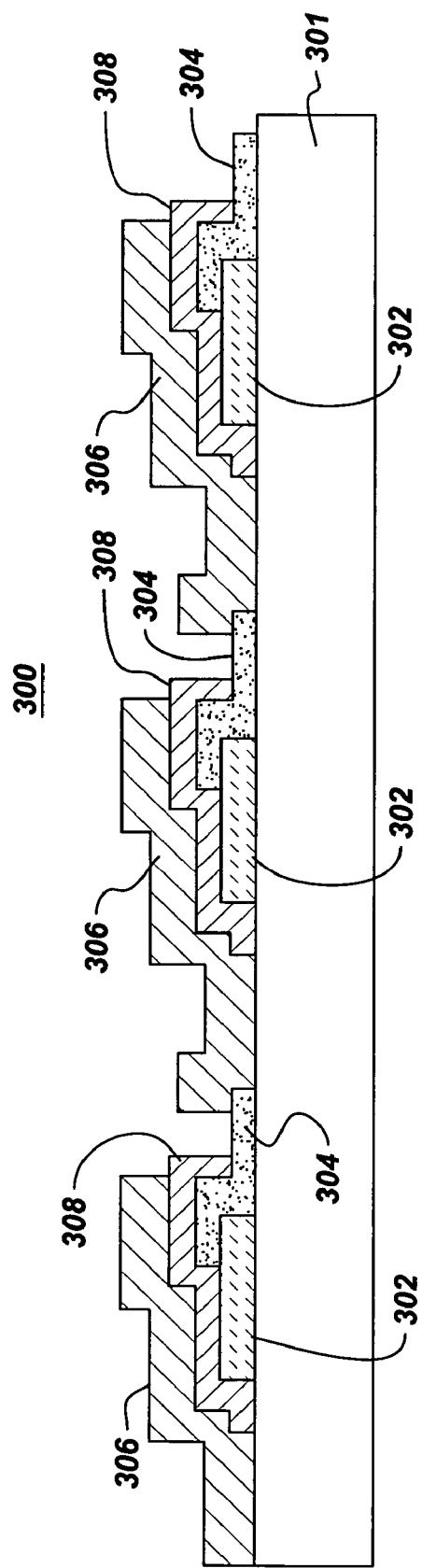
FIGS. 11 and 12 are a side view and top view, respectively, of a light emitting device according to another embodiment of the invention.
Figure 12:
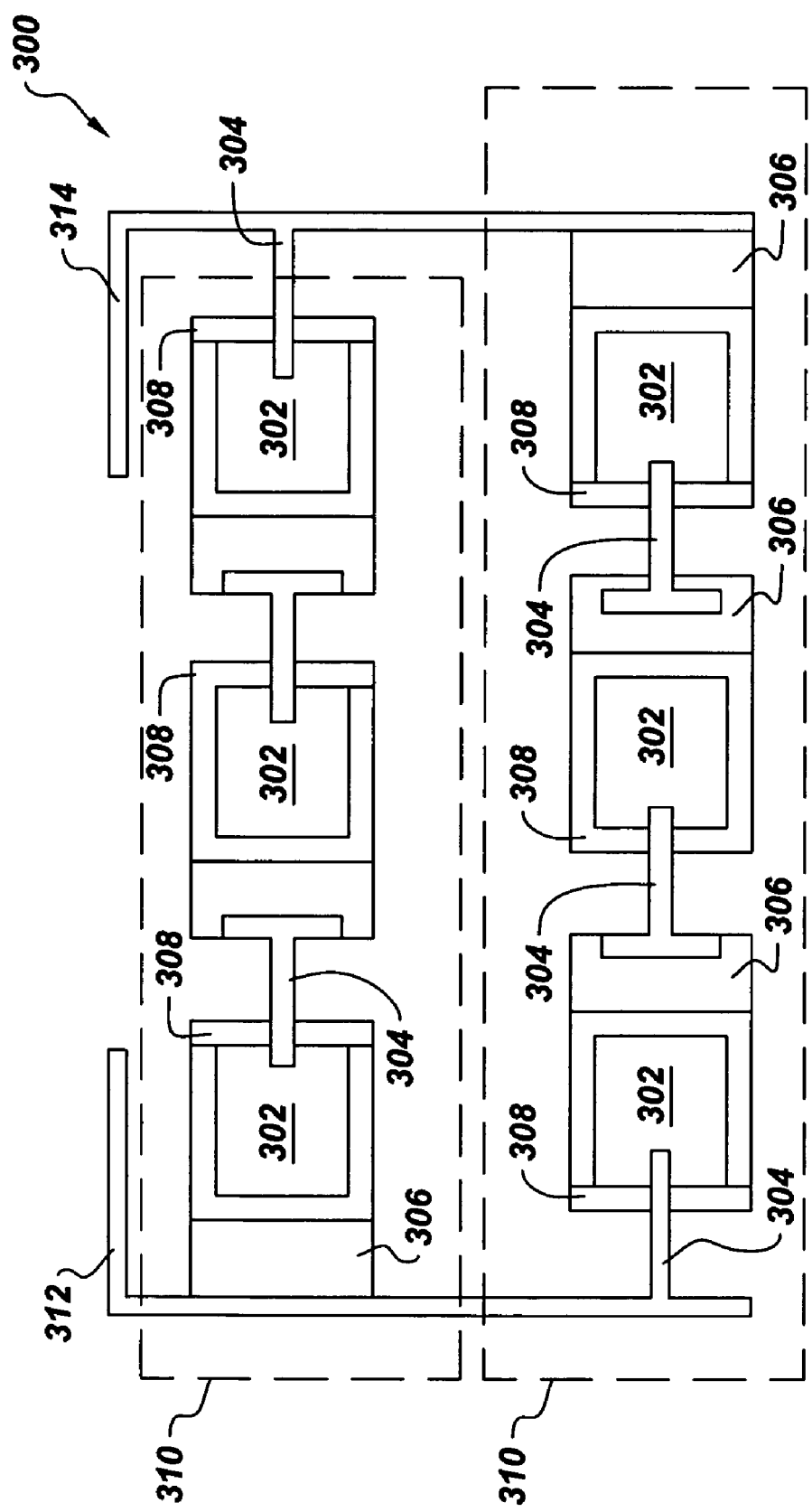

FIGS. 11 and 12 show a side view and top view of another embodiment of the present invention. In FIG. 11, the light emitting device 300 includes a substrate 301. The substrate 301 may be, for example, a glass or some other transparent substrate. Provided on the substrate are first electrodes (anodes) 302 of the OLED modules. Also provided on the substrate and in electrical contact with respective first electrodes 302, are interconnects 304. The interconnects 304 provide electric connection between the first electrode 302 of one OLED module and a respective second electrode (cathode) 306 of another OLED. Thus, the OLED modules are connected in series. An organic light emitting layer 308 is provided between the first and second electrodes, 302 and 306, respectively. Preferably, the first electrode 302 is transparent to allow light from the organic light emitting layer 308 to pass. Collectively a first electrode 302, second electrode 306 and organic light emitting layer 308 form an OLED module.

As seen in FIG. 12, groups of modules are connected in series to form series groups 310. The opposing end electrodes of the series groups 310 are electrically connected, respectively to a first conducting line 312 and a second conducting line 314. Preferably, the two series groups 310 are arranged such that the electrode of one of the series groups that is connected to the first conducting line 312, has the opposite polarity of the electrode of the other series group that is connected to the first conducting line 312. AC power may be applied to the first conducting line 312 and the second conducting line 314 via an external AC power source.

A method of making a light emitting device according to the present invention is now described with respect to FIGS. 11 and 12. The substrate 302 is first provided. A first conducting material is then deposited over the substrate. The first conducting material may comprise a first conducting electrode material and a first conducting interconnect material. Alternatively, if the OLED modules are to be electrically connected without a separate interconnect material, i.e., the first conducting electrode material is used to form the interconnect, the first conducting material may be only the first conducting electrode material. The first conducting electrode material is preferably a conducting transparent material such as indium tin oxide (ITO), tin oxide, nickel, or gold. The first conducting interconnect material may be any suitable conducting interconnect material such as copper, aluminum or titanium. Alternatively, the first conducting interconnect material may be an organic conductor such as poly(3,4)ethylenedioxythiophene/polystyrenesulphonate (PEDT/PSS), for example, available from Bayer Corporation, which can be applied by conventional methods such as spin coating.

The first conducting electrode 302 may be formed by depositing the first conducting electrode material selectively onto the substrate. Alernatively, the first conducting electrode material may be blanket deposited and then masked and etched to pattern the first conducting electrode 302. For example, the first conducting electrode material may be deposited by sputtering. The 304 may be formed by depositing the first conducting interconnect material over and in contact with the first conducting electrode 302. The first conducting interconnect material may then be masked and etched to form the interconnect 304.

Alternatively, if the first conducting electrode 302 and interconnect 304 are to be formed of the same material, they may be formed by depositing a single layer and performing a single mask and etch to form a combination first electrode 302 and interconnect 304.

After the first electrode 302 and the interconnect 304 are patterned, the organic light emitting layer 308 may then be formed. The organic light emitting layer 308 may be formed by evaporating an organic light emitting material through a shadow mask and in electrical contact with the first conducting electrode 302. Alternatively, the organic light emitting layer 308 may be formed by depositing organic light emitting material over the substrate, for example by a spin-on process, and etching the deposited organic light emitting material with an appropriate etchant. As another alternative, the organic light emitting layer 308 may be formed by selectively depositing organic light emitting material over the substrate and in electrical contact with the first conducting electrode 302, such as by ink jet printing.

After the organic light emitting layer 308 is formed, the second conducting electrode 306 may be formed. For example, the second conducting electrode 306 may be formed by evaporating the second conducting material through a shadow mask. The second conducting material may comprise, for example, calcium or a metal such as gold, indium, manganese, tin, lead, aluminum, silver, magnesium, or a magnesium/silver alloy. The second conducting electrode 306 may also be formed by a blanket deposition of the second conducting material followed by etching to pattern.

The first and second conducting lines 310 and 312 are formed, for example, by depositing a conducting material such as aluminum or copper, and patterning the conducting material to form the lines. Alternatively, the first and second conducting lines 310 and 312 may be formed by selective deposition, such as by a plating process.

I. The Components of the OLED Module

Figure 13:
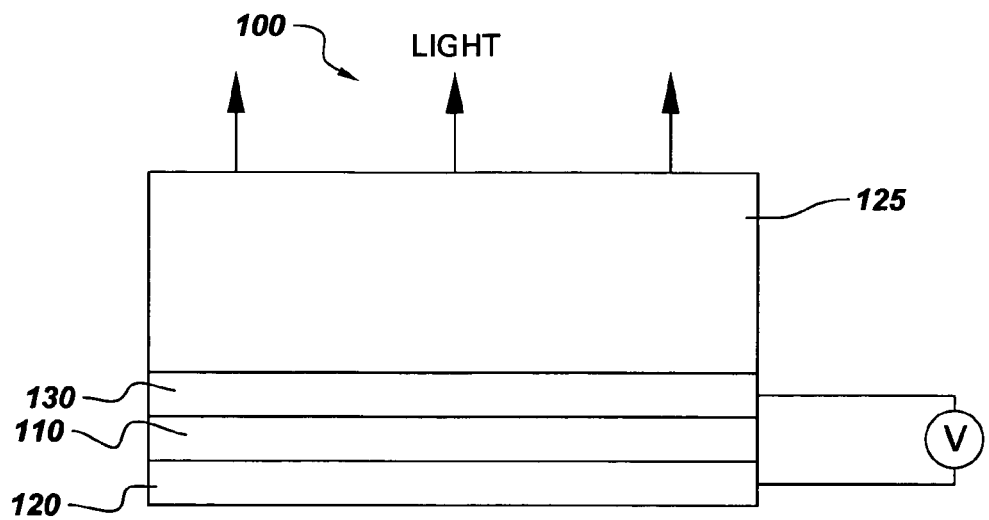
FIG. 13 is a side view of an OLED module of a light emitting device according to an embodiment of the invention.

The OLED module of the invention may comprise any type of organic light emitting device, such as an OLED device. The term "light" includes visible light as well as UV and IR radiation. The OLED module 100 according to one preferred aspect of the present invention is illustrated in FIG. 13. The OLED module 100 includes an organic light emitting layer 110 disposed between two electrodes, e.g., a cathode 120 and an anode 130. The organic light emitting layer 110 emits light upon application of a voltage across the anode and cathode from the voltage source "V". The OLED module 100 typically includes a device substrate 125, such as glass or transparent plastics such as PET (MYLAR®), polycarbonate, and the like, as shown in FIG. 13. The term OLED module generally refers to the combination which includes the organic light emitting layer, the cathode, and the anode, and which may also include other elements such as the device substrate, device electrical contacts, and a photoluminescent layer, as will be described below.

A. The Electrodes

The anode and cathode inject charge carriers, i.e., holes and electrons, into the organic light emitting layer 110 where they recombine to form excited molecules or excitons which emit light when the molecules or excitons decay. The color of light emitted by the molecules depends on the energy difference between the excited state and the ground state of the molecules or excitons. Typically, the applied voltage is about 3–10 volts but can be up to 30 volts or more, and the external quantum efficiency (photons out/electrons in) is between 0.01% and 5%, but could be up to 10%, 20%, 30%, or more. The organic light emitting layer 110 typically has a thickness of about 50–500 nanometers, and the electrodes 120, 130 each typically have a thickness of about 100–1000 nanometers.

The cathode 120 generally comprises a material having a low work function value such that a relatively small voltage causes emission of electrons from the cathode. The cathode 120 may comprise, for example, calcium or a metal such as gold, indium, manganese, tin, lead, aluminum, silver, magnesium, or a magnesium/silver alloy. Alternatively, the cathode can be made of two layers to enhance electron injection. Examples include a thin inner layer of LiF followed by a thicker outer layer of aluminum or silver, or a thin inner layer of calcium followed by a thicker outer layer of aluminum or silver.

The anode 130 typically comprises a material having a high work function value. The anode 130 is preferably transparent so that light generated in the organic light emitting layer 110 can propagate out of the OLED module 100. The anode 130 may comprise, for example, indium tin oxide (ITO), tin oxide, nickel, or gold. The electrodes 120, 130 can be formed by conventional vapor deposition techniques, such as evaporation or sputtering, for example.

B. The Organic Emitting Layer(s)

A variety of organic light emitting layers 110 can be used in conjunction with exemplary embodiments of the invention. According to one embodiment shown in FIG. 13, the organic light emitting layer 110 comprises a single layer. The organic light emitting layer 110 may comprise, for example, a conjugated polymer which is luminescent, a hole-transporting polymer doped with electron transport molecules and a luminescent material, or an inert polymer doped with hole transporting molecules and a luminescent material. The organic light emitting layer 110 may also comprise an amorphous film of luminescent small organic molecules which can be doped with other luminescent molecules.

According to other embodiments of the invention shown in FIGS. 14–17, the organic light emitting layer 110 comprises two or more sublayers which carry out the functions of hole injection, hole transport, electron injection, electron transport, and luminescence. Only the luminescent layer is required for a functioning device. However, the additional sublayers generally increase the efficiency with which holes and electrons recombine to produce light. Thus the organic light emitting layer 110 can comprise 1–4 sublayers including, for example, a hole injection sublayer, a hole transport sublayer, a luminescent sublayer, and an electron injection sublayer. Also, one or more sublayers may comprise a material which achieves two or more functions such as hole injection, hole transport, electron injection, electron transport, and luminescence.

Embodiments in which the organic light emitting layer 110 comprises a single layer, as shown in FIG. 13, will now be described. According to one embodiment, the organic light emitting layer 110 comprises a conjugated polymer. The term conjugated polymer refers to a polymer which includes a delocalized π-electron system along the backbone of the polymer. The delocalized π-electron system provides semiconducting properties to the polymer and gives it the ability to support positive and negative charge carriers with high mobilities along the polymer chain. The polymer film has a sufficiently low concentration of extrinsic charge carriers that on applying an electric field between the electrodes, charge carriers are injected into the polymer and radiation is emitted from the polymer. Conjugated polymers are discussed, for example, in R. H. Friend, 4 Journal of Molecular Electronics 37–46 (1988).

One example of a conjugated polymer which emits light upon application of a voltage is PPV (poly(p-phenylenevinylene)). PPV emits light in the spectral range of about 500–690 nanometers and has good resistance to thermal and stress induced cracking. A suitable PPV film typically has a thickness of about 100–1000 nanometers. The PPV film can be formed by spin coating a solution of the precursor to PPV in methanol onto a substrate and heating in a vacuum oven.

Various modifications can be made to the PPV while retaining its luminescent properties. For example, the phenylene ring of the PPV can optionally carry one or more substituents each independently selected from alkyl, alkoxy, halogen, or nitro. Other conjugated polymers derived from PPV may also be used in conjunction with exemplary embodiments of the invention. Examples of such derivatives of PPV include: 1) polymers derived by replacing the phenylene ring with a fused ring system, e.g. replacing the phenylene ring with an anthracene or napthalene ring system. These alternative ring systems may also carry one or more substituents of the type described above with respect to the phenylene ring; 2) polymers derived by replacing the phenylene ring with a heterocyclic ring system such as a furan ring. The furan ring may carry one or more substituents of the type described above in connection with the phenylene ring; 3) polymers derived by increasing the number of vinylene moieties associated with each phenylene or other ring system. The above described derivatives have different energy gaps, which allows flexibility in producing an organic light emitting layer 110 which emits in a desired color range or ranges. Additional information on luminescent conjugated polymers is described in U.S. Pat. No. 5,247,190, which is hereby incorporated by reference.

Other examples of suitable conjugated polymers include polyfluorenes such as 2,7-substituted-9-substituted fluorenes and 9-substituted fluorene oligomers and polymers. Polyfluorenes generally have good thermal and chemical stability and high solid-state fluorescence quantum yields. The fluorenes, oligomers and polymers may be substituted at the 9-position with two hydrocarbyl moieties which may optionally contain one or more of sulfur, nitrogen, oxygen, phosphorous or silicon heteroatoms; a $C_{5-20}$ ring structure formed with the 9-carbon on the fluorene ring or a $C_{4-20}$ ring structure formed with the 9-carbon containing one or more heteroatoms of sulfur, nitrogen or oxygen; or a hydrocarbylidene moiety. According to one embodiment, the fluorenes are substituted at the 2- and 7-positions with aryl moieties which may further be substituted with moieties which are capable of crosslinking or chain extension or a trialkylsiloxy moiety. The fluorene polymers and oligomers may be substituted at the 2- and 7-positions. The monomer units of the fluorene oligomers and polymers are bound to one another at the 2- and 7'-positions. The 2,7'-aryl-9-substituted fluorene oligomers and polymers may be further reacted with one another to form higher molecular weight polymers by causing the optional moieties on the terminal 2,7'-aryl moieties, which are capable of crosslinking or chain extension, to undergo chain extension or crosslinking.

The above described fluorenes and fluorene oligomers or polymers are readily soluble in common organic solvents. They are processable into thin films or coatings by conventional techniques such as spin coating, spray coating, dip coating and roller coating. Upon curing, such films demonstrate resistance to common organic solvents and high heat resistance. Additional information on such polyfluorenes is described in U.S. Pat. No. 5,708,130, which is hereby incorporated by reference.

Other suitable polyfluorenes which can be used in conjunction with exemplary embodiments of the invention include poly(fluorene) copolymers, such as poly(fluorene-co-anthracene)s, which exhibit blue electroluminescence. These copolymers include a polyfluorene subunit such as 2,7-dibromo-9,9-di-n-hexylfluorene (DHF) and another subunit such as 9,10-dibromoanthracene (ANT). High molecular weight copolymers from DHF and ANT can be prepared by the nickel-mediated copolymerization of the corresponding aryl dibromides. The final polymer molecular weight can be controlled by adding the end capping reagent 2-bromofluorene at different stages of the polymerization. The copolymers are thermally stable with decomposition temperatures above 400° C. and are soluble in common organic solvents such as tetrahydrofuran (THF), chloroform, xylene, or chlorobenzene. They emit blue light having a wavelength of about 455 nm. Additional information on such polyfluorenes is described in Gerrit Klarner et al., "Colorfast Blue Light Emitting Random Copolymers Derived from Di-n-hexylfluorene and Anthracene", 10 Adv. Mater. 993–997 (1998), which is hereby incorporated by reference. Another preferred blue light emitting polyfluorine is poly(9,9-di-n-hexylfluorine-2,7-diyl) which has a broad double emission peak between about 415 and 460 nm.

According to another embodiment of a single layer module as shown in FIG. 13, the organic light emitting layer 110 comprises a molecularly doped polymer. A molecularly doped polymer typically comprises a binary solid solution of charge transporting molecules which are molecularly dispersed in an inert polymeric binder. The charge transporting molecules enhance the ability of holes and electrons to travel through the doped polymer and recombine. The inert polymer offers many alternatives in terms of available dopant materials and mechanical properties of the host polymer binder.

One example of a molecularly doped polymer comprises poly(methyl methacrylate) (PMMA) molecularly doped with the hole transporting molecule N,N'-diphenyl-N,N'-bis (3-methylsphenyl)-1,1'-biphenyl-4,4'-diamine (TPD) and the luminescent material tris(8-quinolinolato)-aluminum (III) (Alq). TDP has a high hole drift mobility of $10^{-3}$ cm$^2$/volt-sec, while Alq is a luminescent metal complex having electron transporting properties in addition to its luminescent properties.

The doping concentration is typically about 50%, while the molar ratio of TDP to Alq may vary from about 0.4 to 1.0, for example. A film of the doped PMMA can be prepared by mixing a dichloroethane solution containing suitable amounts of TPD, Alq, and PMMA, and dip coating the solution onto the desired substrate, e.g. an indium tin oxide (ITO) electrode. The thickness of the doped PMMA layer is typically about 100 nanometers. When activated by application of a voltage, a green emission is generated. Additional information on such doped polymers is described in Junji Kido et al., "Organic Electroluminescent Devices Based on Molecularly Doped Polymers", 61 Appl. Phys. Lett. 761–763 (1992), which is hereby incorporated by reference.

Figure 14:
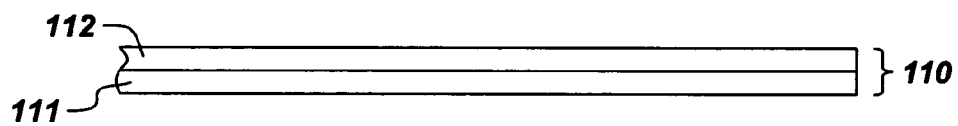
FIG. 14-17 illustrate various examples of organic light emitting layers formed of two or more sublayers.

According to another embodiment of the OLED module of the invention shown in FIG. 14, the organic light emitting layer 110 comprises two sublayers. The first sublayer 111 provides hole transport, electron transport, and luminescent properties and is positioned adjacent the cathode 120. The second sublayer 112 serves as a hole injection sublayer and is positioned adjacent the anode 130. The first sublayer 111 comprises a hole-transporting polymer doped with electron transporting molecules and a luminescent material, e.g. a dye or polymer. The hole-transporting polymer may comprise poly(N-vinylcarbazole) (PVK), for example. The electron transport molecules may comprise 2-(4-biphenyl)-5-(4-tert-butylphenyl)-1,3,4-oxadiazole (PBD), for example. The luminescent material typically comprises small molecules or polymers which act as emitting centers to vary the emission color. For example, the luminescent materials may comprise the organic dyes coumarin 460 (blue), coumarin 6 (green) or nile red. Thin films of these blends can be formed by spin coating a chloroform solution containing different amounts of PVK, electron transport molecules, and luminescent materials. For example, a suitable mixture comprises 100 weight percent PVK, 40 weight percent PBD, and 0.2–1.0 weight percent organic dye.

The second sublayer 112 serves as a hole injection sublayer and may comprise poly(3,4)ethylenedioxythiophene/polystyrenesulphonate (PEDT/PSS), for example, available from Bayer Corporation, which can be applied by conventional methods such as spin coating. Additional information on hole-transporting polymers doped with electron transporting molecules and a luminescent material is described in Chung-Chih Wu et al., "Efficient Organic Electroluminescent Devices Using Single-Layer Doped Polymer Thin Films with Bipolar Carrier Transport Abilities", 44 IEEE Trans. on Elec. Devices 1269–1281 (1997), which is hereby incorporated by reference.

Figure 15:
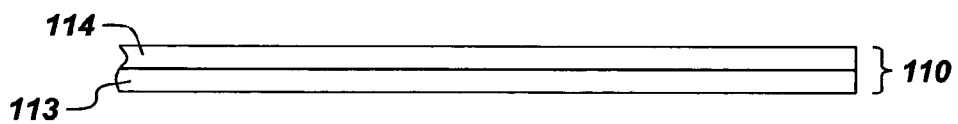

According to another embodiment of the OLED module of the invention shown in FIG. 15, the organic light emitting layer 110 includes a first sublayer 113 comprising a luminescent sublayer and a second sublayer 114 comprising a hole transporting sublayer. The hole transporting sublayer 114 may comprise an aromatic amine that is readily and reversibly oxidizable, for example. One example of such a luminescent sublayer and a hole transporting sublayer is described in A. W. Grice et al, "High Brightness and Efficiency of Blue Light-Emitting Polymer Diodes", 73 Appl. Phys. Letters 629–631 (1998), which is hereby incorporated by reference. The device described therein comprises two polymer layers sandwiched between an ITO electrode and a calcium electrode. The polymer layer next to the ITO is a hole transport layer and comprises a polymeric triphenyldiamine derivative (poly-TPD). The blue emitting polymer layer which is next to the calcium electrode is poly(9,9-dioctylfluorene).

Figure 16:
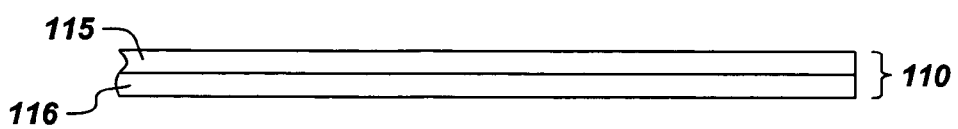

According to another embodiment of the OLED module of the invention shown in FIG. 16, the organic light emitting layer 110 comprises a first sublayer 115 which includes luminescent and hole transport properties, and a second sublayer 116 which includes electron injection properties.

The first sublayer 115 comprises a polysilane, and the second sublayer comprises an oxadiazole compound. This structure produces ultraviolet (UV) light.

Polysilanes are linear silicon (Si)-backbone polymers substituted with a variety of alkyl and/or aryl side groups. In contrast to π-conjugated polymers, polysilanes are quasi one-dimensional materials with delocalized σ-conjugated electrons along the polymer backbone chain. Due to their one-dimensional direct-gap nature, polysilanes exhibit a sharp photoluminescence with a high quantum efficiency in the ultraviolet region. Examples of suitable polysilanes include poly(di-n-butylsilane) (PDBS), poly(di-n-pentylsilane) (PDPS), poly(di-n-hexylsilane) (PDHS), poly(methylphenylsilane) (PMPS), and poly[-bis(p-butylphenyl)silane] (PBPS). The polysilane sublayer 115 can be applied by spin coating from a toluene solution, for example. The electron injection sublayer 116 may comprise 2,5-bis(4-biphenyl)-1, 3,4-oxadiazole (BBD), for example. Additional information on UV-emitting polysilane organic light emitting layers is described in Hiroyuki Suzuki et al, "Near-ultraviolet Electroluminescence from Polysilanes", 331 Thin Solid Films 64–70 (1998), which is hereby incorporated by reference.

Figure 17:
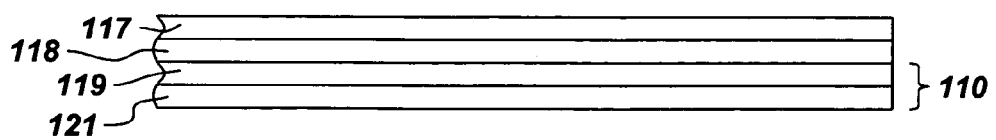

According to another embodiment of the OLED module of the invention shown in FIG. 17, the organic light emitting layer 110 comprises a hole injecting sublayer 117, a hole transporting sublayer 118, a luminescent sublayer 119, and an electron injecting sublayer 121. The hole injecting sublayer 117 and hole transporting sublayer 118 efficiently provide holes to the recombination area. The electrode injecting sublayer 121 efficiently provides electrons to the recombination area.

The hole injecting sublayer 117 may comprise a porphyrinic compound, such as a metal free phthalocyanine or a metal containing phthalocyanine, for example. The hole transporting sublayer 118 may comprise a hole transporting aromatic tertiary amine, where the latter is a compound containing at least one trivalent nitrogen atom that is bonded only to carbon atoms, at least one of which is a member of an aromatic ring. The luminescent sublayer 119 may comprise, for example, a mixed ligand aluminum chelate emitting in the blue wavelengths, such as bis(R-8-quinolinolato)-(phenolato)aluminum(III) chelate where R is a ring substituent of the 8-quinolinolato ring nucleus chosen to block the attachment of more than two 8-quinolinolato ligands to the aluminum atom. The electron injection sublayer 121 may comprise a metal oxinoid charge accepting compound such as a tris-chelate of aluminum. Additional information on such four-layer materials and devices are described in U.S. Pat. No. 5,294,870, which is hereby incorporated by reference.

The above examples of organic light emitting layers 110 can be used to design an organic light emitting device which emits in one or more desired colors. For example, the OLED module 100 can emit ultraviolet, blue, green, or red light.

C. Sealing Member and Contacts

Figure 18:
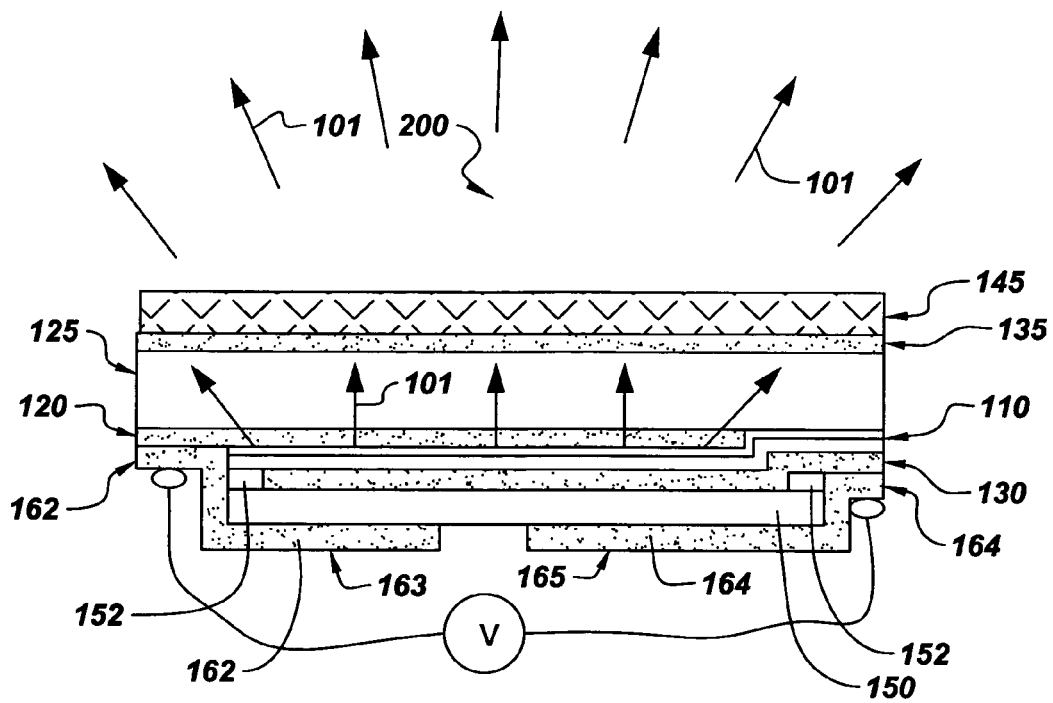
FIG. 18 is a side view of an OLED module of a light emitting device according to another embodiment of the invention.
Figure 19:
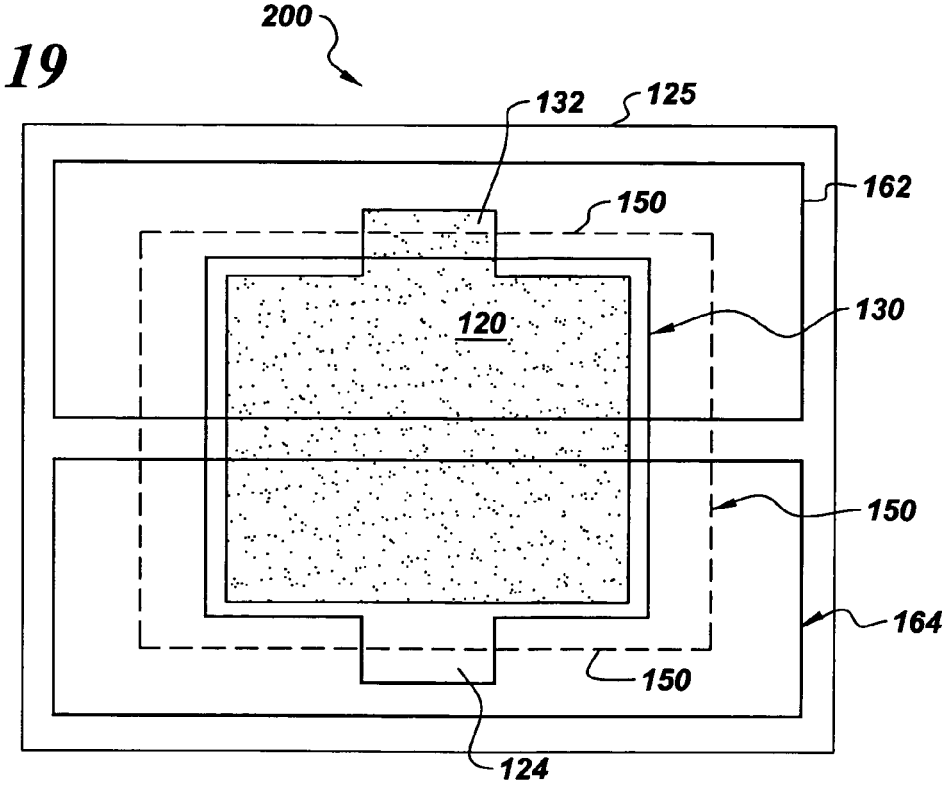
FIG. 19 is a bottom view of the OLED module of FIG. 18.

Referring to FIGS. 18 and 19, an OLED module of the light emitting device is shown according to another embodiment of the invention. The OLED module 200 comprises an organic light emitting layer 110, a cathode 120, and an anode 130 which is light transmissive. The OLED module 200 also includes a substrate 125 which is light transmissive. The elements in FIGS. 18 and 19 (e.g. the anode 130, cathode 120, light emitting layer 110) corresponding to those in FIG. 13 can be formed of the same materials as described above with respect to FIG. 13. Upon application of a voltage, light (represented by arrows 101) is generated in the light emitting layer 110 and propagates through the anode 130 and the substrate 125.

Adjacent to the cathode 120 is a sealing member 150, typically comprising glass, which provides a barrier to oxygen and water. The sealing member 150, in conjunction with a sealant 152 which may comprise epoxy, a metal, or a glass frit, for example, provides a near hermetic barrier to prevent water and oxygen penetration into the cathode 120, anode 130 and organic light emitting layer 110.

Formed adjacent to the sealing member 150 are first and second electrical contacts 162, 164, which provide electrical connections to the anode 130 and cathode 120, respectively. As shown most clearly in FIG. 19, the first device electrical contact 162 connects electrically to the anode 130 in a tab region 132 of the anode 130. The tab region 132 is beyond the perimeter of the sealing member 150. The second electrical contact 164 connects electrically to the cathode 120 in a tab region 124 of the cathode 120. The tab region 124 is beyond the perimeter of the sealing member 150. The organic light emitting layer 110 (not shown in FIG. 19) typically occupies at least the overlap region of the anode 130 and cathode 120 and may extend beyond these electrodes.

Referring again to FIG. 18, the electrical contacts 162, 164 typically have respective contacting surfaces 163, 165 which occupy a common plane. These device contacting surfaces 163, 165 facilitate the mounting of one or more OLED modules 200 onto a mounting substrate, as will be described further below in connection with FIG. 18.

An advantageous feature of the electrical contacts 162, 164 can be described with reference to an imaginary surface running through the light emitting layer 110. The imaginary surface, which is typically planar, divides the OLED module 200 into a first side and a second side. The anode 130 is on the first side, and the cathode 120 is on the second side. The light is emitted through the first side, and the electrical contacts 162, 164 extend to the second side. For example, the first electrical contact 162 extends from the anode 130 on the first side to the second side of the OLED module. The second electrical contact 164 extends from the cathode 120 on the second side to another location on the second side of the OLED module. Thus, the OLED module 200 can be powered by contacting both electrical contacts 162, 164 on a common planar surface 163, 165 which is on an opposite side of the OLED module from where the light emission occurs. Typically the planar surface defined by surfaces 163, 165 is parallel to the light emitting layer 110 and the substrate 125. This configuration allows a number of OLED modules 200 to be easily mounted adjacent to each other ("tiled") on a mounting substrate.

As shown in FIG. 19, the substrate 125 can define the area of the OLED module 200. The first and second electrical contacts 162, 164 can occupy an area which is within the area of the substrate 125. Therefore, two OLED devices can be placed directly adjacent to each other without any electrical connectors in between and with a small separation distance between the adjacent light emitting device substrates 125. For example, if desired, the separation distance could be less than 2 centimeters (cm), 1 cm, 0.5 cm or 0.25 cm, but is typically greater than 0.1 cm.

D. The Photoluminescent Layer

As shown in FIG. 18, the OLED module 200 may optionally include a photoluminescent layer 135. The photoluminescent layer 135 comprises a photoluminescent material which absorbs light from the organic light emitting layer 110 and emits light typically having a longer wavelength. The photoluminescent material typically comprises an inorganic phosphor, but may also comprise an organic photoluminescent material such as an organic dye. Examples of phosphor materials that can be utilized include those phosphors based on cerium doped into a $Y_3Al_5O_{12}$ (YAG) lattice which crystallizes in the garnet structure. Specific examples include $(Y_{1-x-y}Gd_xCe_y)_3Al_5O_{12}$ (YAG:Gd,Ce), $(Y_{1-x}Ce_x)_3Al_5O_{12}$ (YAG:Ce), $(Y_{1-x}Ce_x)_3(Al_{1-y}Ga_y)_5O_{12}$ (YAG:Ga,Ce) and $(Y_{1-x-y}Gd_xCe_y)_3(Al_{5-z}Ga_z)_5O_{12}$ (YAG:Gd,Ga,Ce) and $(Gd_{1-x}Ce_x)Sc_2Al_3O_{12}$ (GSAG). The YAG phosphors can be described generally as $(Y_{1-x-y}Gd_x-Ce_y)_3(Al_{1-z}Ga_z)_5O_{12}$, wherein x+y≦1; 0≦x≦1; 0≦y≦1; and 0≦z≦1. The position of the peak of the emission band varies considerably in the aforementioned phosphors. Depending on the garnet composition, the $Ce^{3+}$ emission can be tuned from the green (~540 nm; YAG:Ga,Ce) to the red (~600 nm; YAG:Gd:Ce) without appreciable loss in the luminescence efficiency.

An appropriate phosphor material or blend of phosphor materials in combination with an organic light emitting layer, such as a blue or a UV light emitting light emitting layer, can produce a white field corresponding to a wide range of color temperatures. Light sources in the form of large area white light electroluminescent panels (i.e., having a size of greater than 1 square meter) which closely approximate the color, CRI, and brightness of conventional fluorescent lamps can be made with such phosphors and organic light emitting devices.

For example, a preferred organic blue light emitting polymer layer 110 is poly(9,9-di-n-hexylfluorene-2,7-diyl) and the preferred phosphor material is (YAG:Ce), which absorbs the blue light and emits yellow light, the combination of which appears white to a human observer. The preferred anode material is ITO and the preferred cathode material is the LiF/Al bilayer. The relative weighting of the components is chosen such that the white light is on the blackbody locus (as desired for illumination applications) with a color temperature of 6050K. The expected color rendition index (CRI) is calculated to be >70, preferably 74. The color temperature can be adjusted to vary between 3500K and 6500K on the black body locus by varying the phosphor thickness and composition. This device has an energy efficiency (radiant watts out per electrical watt in) of 1.2%, which can be improved by adding an output coupler.

In addition, more than one phosphor material may be combined together and then utilized with an organic light emitting layer to achieve different colors (i.e., white or other colors), color temperatures, and color rendition indices. Other phosphors which can be used are described in U.S. Ser. No. 09/469,702, entitled "Luminescent Display and Method of Making", filed Dec. 22, 1999, in the name of Anil Duggal and Alok Srivastava, which is hereby incorporated by reference. An example of a suitable red emitting inorganic phosphor is $SrB_4O_7:Sm^{2+}$, where the $Sm^{2+}$ following the colon represents an activator. This phosphor absorbs most visible wavelengths shorter than 600 nm and emits light as a deep red line with a wavelength greater than 650 nm. An example of a suitable green emitting inorganic phosphor is $SrGa_2S_4:Eu^{2+}$. This phosphor absorbs below 500 nm and has a maximum emission at 535 nanometers. An example of a suitable blue emitting inorganic phosphor is $BaMg_2Al_{16}O_{27}:Eu^{2+}$. $BaMg_2Al_{16}O_{27}:Eu^{2+}$ absorbs most wavelengths below 430 nm and has a maximum emission at 450 nm. Examples of organic dyes which can be utilized in the photoluminescent layer include coumarin 460 (blue), coumarin 6 (green), and nile red.

An alternative way of generating white light from the light emitting device without using a phosphor or a dye layer 135 is to utilize a full color display with separately addressable color pixels and tune the colors to emit white light. This approach allows color tunability but the increases complexity and cost. Furthermore, instead of using separately addressable color pixels, a blend of various dye molecules and/or polymers that emit different colors can be placed into the active region of a module to achieve white light. This approach has the advantage of simple, low cost, fabrication. However, different organic components in the device age differently, which leads to a color shift with time. In contrast, the use of the phosphor layer 135 is advantageous because the device does not suffer from color shifts due to differential aging of different organic molecular and polymer components.

If a separate luminescent material 135 is present over the substrate 125, then an output coupler 145 is preferably formed over the luminescent material 135, as illustrated in FIG. 18. Thus, the output coupler 145 is used as a sealing layer to preserve the luminescent material 135, especially if the output coupler comprises a glass material. The index of refraction of the output coupler 145 is preferably matched to that of the luminescent layer 135.

The OLED module 200 may also include an optional scattering layer comprising scattering particles such as $TiO_2$ or $SiO_2$ for effective color mixing and brightness uniformity.

II. Method of Making the OLED Module and Light Emitting Device

Figure 20:
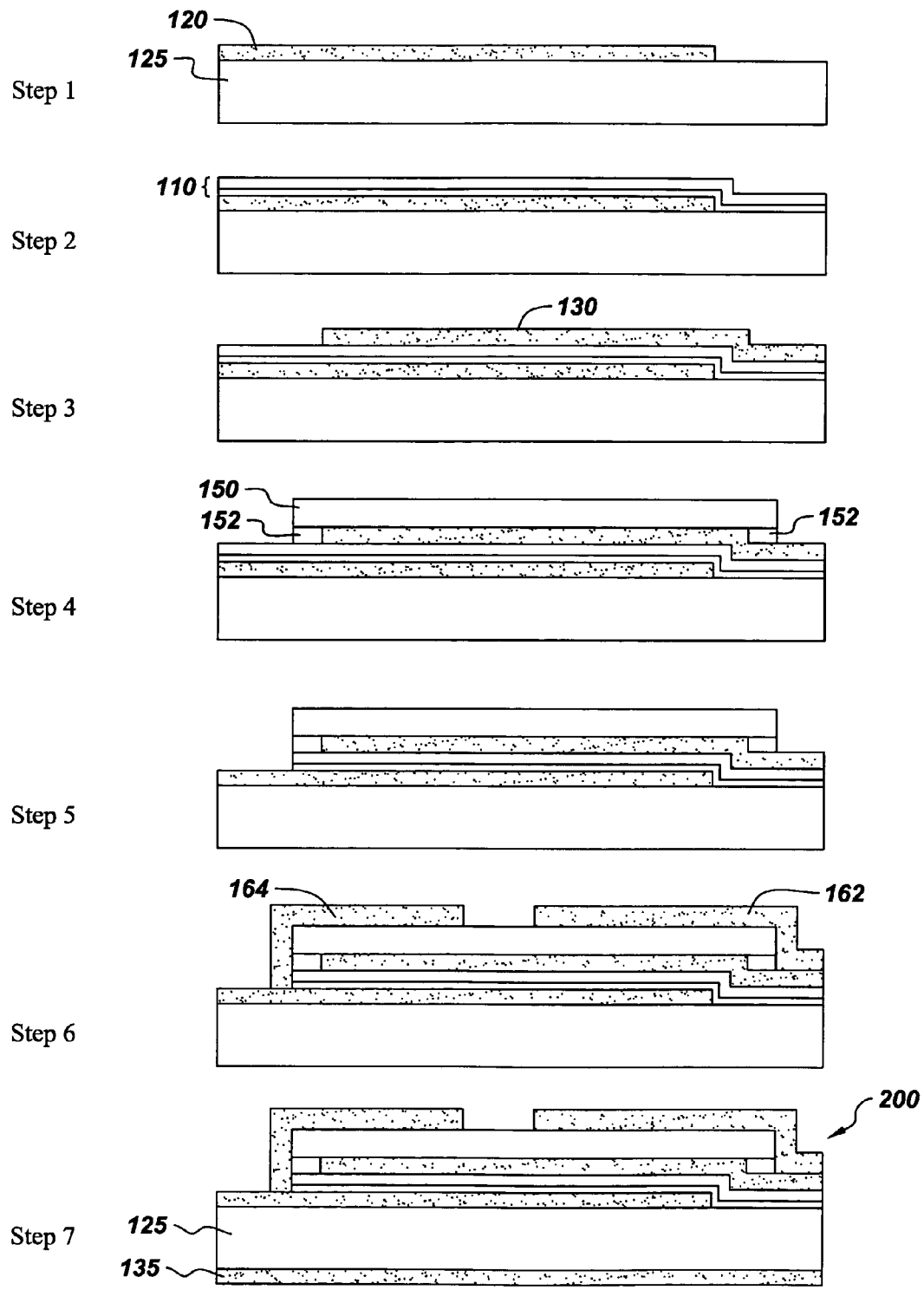
FIG. 20 illustrates a method of making the OLED module of FIG. 18 according to a preferred embodiment of the present invention.

FIG. 20 illustrates a method for forming the OLED module 200 of FIGS. 18 and 19 according to an exemplary embodiment of the invention. As shown in FIG. 20, step 1, a glass substrate 125 is sputter coated with a layer of thin indium tin oxide (ITO). The ITO is then patterned to form the anode 130, e.g. in the pattern shown in FIG. 19. In step 2, the organic light emitting layer 110 (which may include one or more sublayers as shown in FIGS. 13–17) is deposited, for example by spin coating or inkjet processing. In step 3, the cathode 120 is deposited as a reflective structure comprising a thin layer of lithium fluoride overcoated with aluminum, for example. The cathode 120 can be deposited through a stencil mask by evaporation, for example. The sealing member 150, which may comprise glass, for example, is next applied with a sealant 152 in step 4 to form a near hermetic barrier.

In step 5, the organic light emitting layer 110 extending beyond the sealing member 150 is removed by solvent or dry etching methods. The device electrical contacts 162, 164, which may comprise a metal such as aluminum or silver, are then applied to the reflective side of the organic light emitting device 200 in step 6. The electrical contacts 162, 164 allow for external contact to the organic light emitting device and additionally can provide a near hermetic seal to the anode 130, cathode 120, and light emitting layer 110. In step 7, optionally, a layer 135 of photoluminescent material, e.g. an inorganic phosphor, is applied to the device substrate 125. Optionally, a layer of scattering particles can be applied in a subsequent step. The steps shown in FIG. 20 are of course merely an example of a method of making an OLED module, and not intended to be limiting.

After the OLED module 100 is completed, an output coupler 145 can be attached to the substrate 125. If the luminescent material 135 is present over the substrate 125, then the output coupler can be formed over the luminescent material 135.

Figure 21:
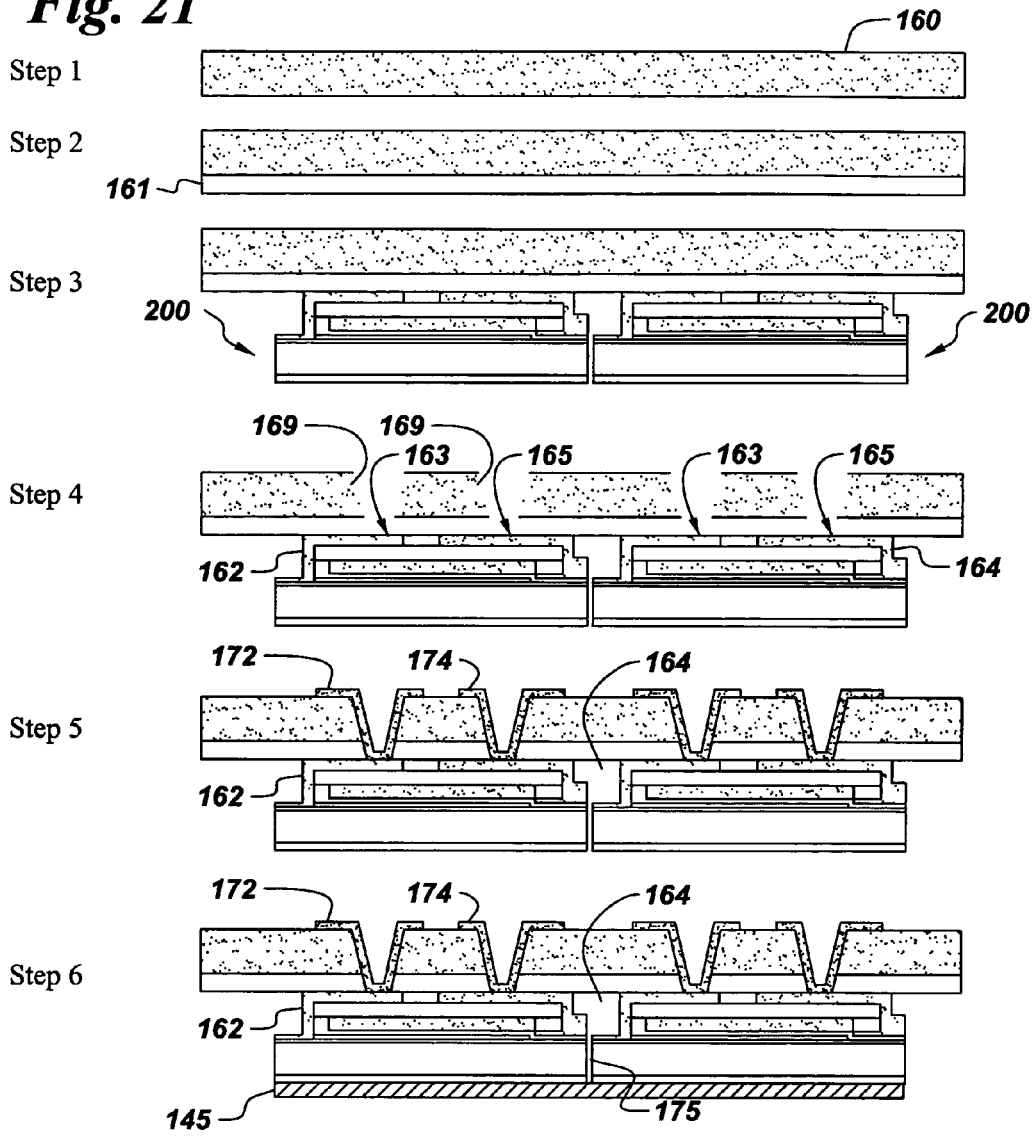
FIG. 21 illustrates a method of mounting a plurality of OLED modules on a mounting substrate to produce a light emitting device according to a preferred embodiment of the invention.

FIG. 21 illustrates a method of mounting one or more OLED modules onto a mounting substrate to form a light emitting device according to an exemplary embodiment of the invention. Step 1 shows the mounting substrate 160, which may comprise a conventional printed circuit board such as FR4 or GETEK, or a flexible polymer film such as Kapton E™ or Kapton H™ polyimide (Kapton is a trademark of E. I. Du Pont de Nemours & Co.), Apical AV polyimide (Apical is a trademark of Kanegafugi Chemical Company), or Upilex polyimide (Upilex is a trademark of UBE Industries, Ltd) for example. In one embodiment, free-standing Kapton™ polyimide is mounted on a rigid frame (not shown in FIG. 21) which rigidly supports the flexible film during processing and for end use if desired. An adhesive, typically comprising a material capable of adhering at a low temperature, can be applied to the rigid frame. Examples of suitable adhesives include materials such as ULTEM polyetherimide (ULTEM™ is a trademark of General Electric Company) and MULTIPOSIT™ XP-9500 thermoset epoxy (MULTIPOSIT is a trademark of Shipley Company Inc., Marlborough, Mass.).

In step 2, according to one embodiment, another adhesive 161, which is typically organic, such as ULTEM™, SPIE (siloxane polyimide epoxy) or other polyimide and epoxy blends, or cyanoacrylate is applied to the mounting substrate 160, as shown in FIG. 21. In step 3, one or more OLED modules 200 are placed on the adhesive 161, and the adhesive is cured to bond the OLED modules 200 to the mounting substrate 160.

The individual modules 200 may, if desired, be tiled to spell out letters or depict an image, such as the letters depicted in the embodiment of the invention of FIG. 3. Alternatively each module 200 could be its own letter as in FIG. 4.

In step 4, vias 169 are formed using laser ablation or reactive ion etching, for example, through the mounting substrate 160 and the adhesive 161 to the device contacting surfaces 163, 165 of the electrical contacts 162, 164, respectively. In step 5, first and second mounting electrical contacts 172, 174 are formed or inserted into the via holes 169 to make contact with the electrical contacts 162, 164, respectively.

The mounting electrical contacts 172, 174 can be formed as a patterned metal layer using sputter or electroless plating techniques, in combination with electroplating if desired, and patterned with a standard photoresist and etch process. The interconnect metallization in one embodiment comprises a thin adhesion layer of 1000 angstroms (Å) sputtered titanium, coated by a thin layer of 3000 Å sputtered copper, coated by a layer of electroplated copper to a thickness of 4 microns, for example. An optional buffer layer of 1000 Å of titanium can be applied over the electroplated copper. The mounting electrical contacts 172, 174 can also be applied by the conventional methods of evaporation with a shadow mask or screen printing.

In step 6, optionally, the output coupler and/or a scattering layer can be applied to OLED modules 200 individually, or more typically can be applied across a number of OLED modules 200, as shown in FIG. 21. Although not shown in step 6, a nonconductive material such as SPIE (siloxane polyimide epoxy) can be inserted into the gaps 175 between adjacent OLED modules 200. Although only two OLED modules 200 are shown in FIG. 21 for the sake of simplicity of illustration, this method can of course be used to make large area light sources comprising many individual OLED modules 200.

Although embodiments of the present invention allow the OLED modules 200 to be placed very close to each other on the mounting substrate 160, it may be desirable in some applications to have a larger spacing between individual OLED modules 200. In such cases, it may not be desirable to have a scattering layer which bridges adjacent OLED modules 200.

Spacing between OLED modules 200 may also occur in the case where the mounting substrate 160 is designed to be flexible, curved, or non-planar. The mounting substrate 160 may be formed in any desired shape, e.g. to conform to an existing building structure. The OLED modules 200 can be sized such that they collectively follow the shape of the mounting substrate. Thus, the combination of a flexible, curved, or non-planar mounting substrate and appropriately sized OLED modules 200 can produce a light source having an emitting surface in many desired shapes, e.g. cylindrical, spherical, etc. The spacing of the OLED modules 200 on the mounting substrate 160 can also be designed such that the mounting substrate 160 can form a right angle between adjacent OLED modules 200. In this case, the emitting surfaces of adjacent OLED modules would together form a corner with perpendicular emitting surfaces.

Figure 22:
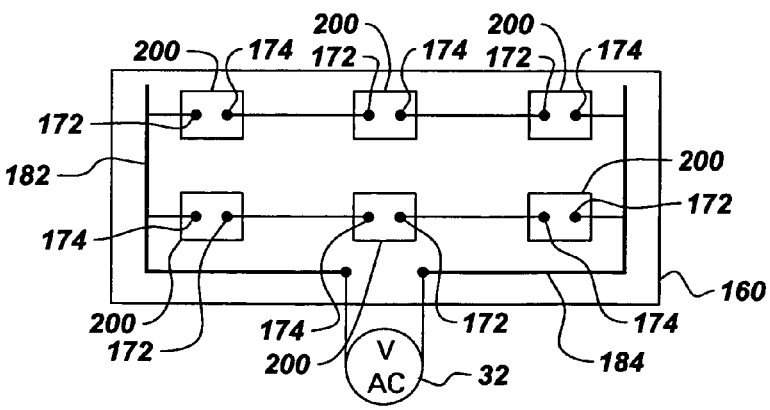
FIG. 22 is a diagram of electrical connections to a plurality of OLED modules of a light emitting device according to a preferred embodiment of the invention.

After the mounting electrical contacts have been installed, they can be connected to a suitable AC power supply. FIG. 22 illustrates an example of a connection layout for six OLED modules 200 arranged into two series groups 210 of three modules 200 each. The modules of each of the two series groups are electrically connected in a series arrangement. For one of the series groups 210, the first conducting layer or line 182 is electrically connected to a first mounting electrical contact 172 of a first module. The second mounting electrical contact 174 of the first module is connected to a first mounting electrical contact 172 of the middle module, and the second mounting electrical contact 174 of the middle module is connected to a first mounting electrical contact 172 of a last module as shown in FIG. 22. The second line 184 connects to the second mounting electrical contact 174 of the last module to complete the series connections. The other of the two series groups is connected with opposite polarity. Upon application of an AC voltage, the plurality of OLED modules 200 of one group are activated for one half cycle, and then the modules of the other group are activated for the next half cycle. One advantage of exemplary embodiments of the invention is that the connecting structure, e.g. as shown in FIG. 22, can utilize highly conductive materials such as copper to efficiently carry power to the individual OLED modules 200.

EXAMPLES

A light emitting device including OLED modules according to the present invention was fabricated. The light emitting device consisted of two series groups each of which consisted of two OLED modules. Each OLED module consisted of a green-emitting OLED device made in the following manner. Indium tin oxide (ITO) coated glass (15 ohm-square) was obtained from Applied Films Corporation, and portions of it were etched away using vapors of aqua regia to provide an ITO pattern. This substrate was then mechanically cleaned with a detergent, soaked in a methanol solution followed by a boiling isopropyl alcohol solution, and finally placed in an ozone cleaner for 15 minutes. An approximately 30 nm layer of poly(3,4)ethylenedioxythiophene/polystyrenesulphonate (PEDT/PSS) from Bayer Corporation was then spin coated onto the ITO. Approximately 70 nm of a green-emitting polymer (Green-B purchased from Dow Chemical Co.) was then spin coated onto the PEDT/PSS layer using xylene as the solvent. Next, a cathode consisting of an approximately 0.8 nm layer of lithium fluoride followed by about 200 nm of aluminum was evaporated onto the device through a shadow-mask to define the cathode pattern. The cathode deposition was carried out in a glove box. After deposition of the cathode, a glass slide was attached to the cathode device with epoxy in order to provide encapsulation. The resulting device consists of two independently addressable OLEDs which emit green light in a rectangular pattern.

Figure 23:
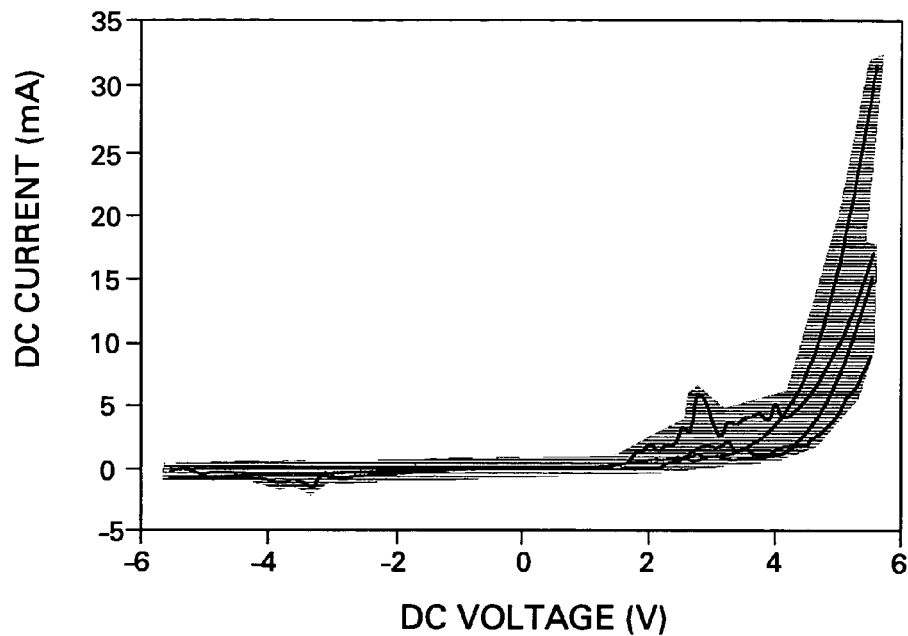
FIG. 23 is a graph of the current versus voltage of individual OLED modules under DC power.
Figure 24:
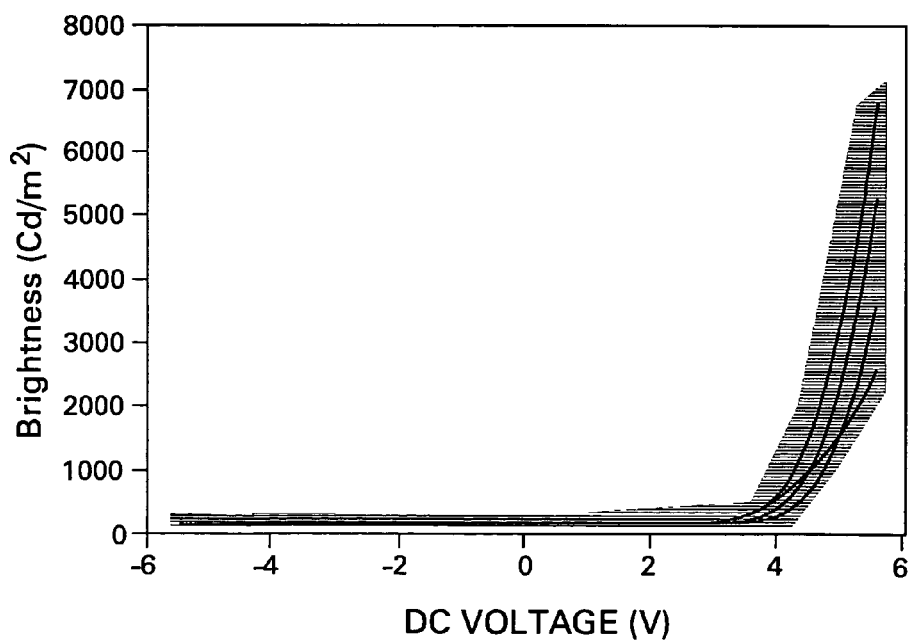
FIG. 24 is a graph of the brightness versus voltage of individual OLED modules under DC power.

Each module consisted of two individual OLED devices of which only one was utilized. The current versus voltage and brightness versus voltage for each of the devices utilized were first measured under direct current (DC) conditions. The resulting data curves are shown in FIGS. 23 and 24. The curves were not identical for each device due to uncontrolled variations in processing conditions and sample history.

Figure 25:
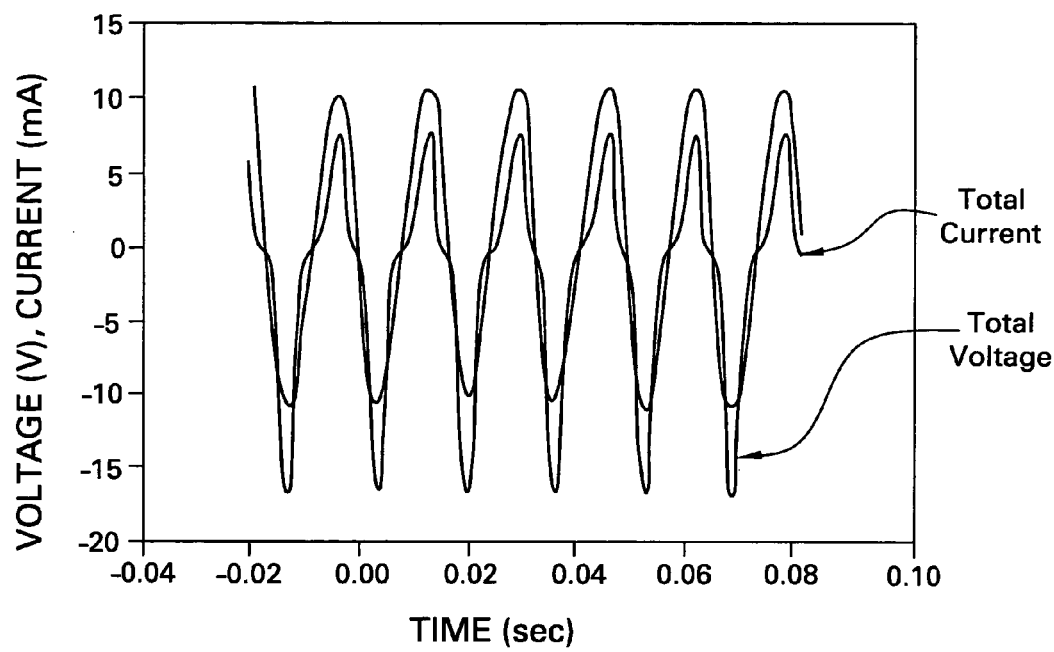
FIG. 25 is a graph of the current and voltage waveforms of an example of the light emitting device of the present invention.
Figure 26:
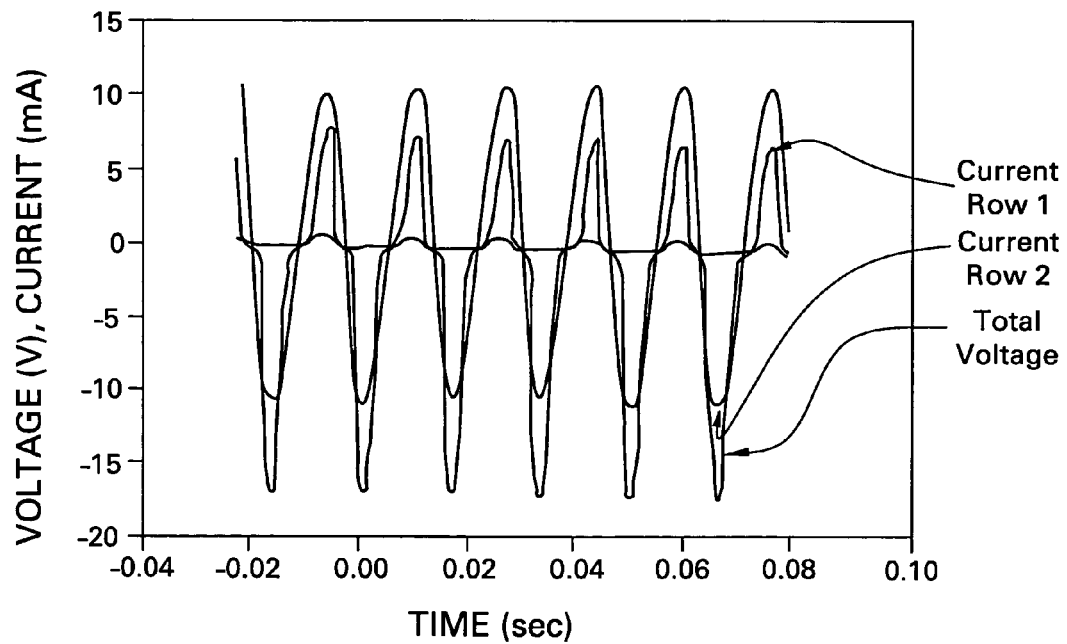
FIG. 26 is a graph of the current and voltage waveforms of the individual rows of modules of the light emitting device of FIG. 25.

The four OLED modules were then taped to a cardboard substrate in two rows, each row having two modules. These two rows defined the series groups of the device. Within each row, the cathode of one module was connected to the anode of the other module. The free anode and cathode of each row were then connected with opposite polarity to the output of a variable transformer. The input to the transformer was the standard 110V AC line voltage. When the output of the transformer was set to approximately 8V rms, all four modules provided light with a brightness of roughly 300 $Cd/m^2$. (The actual measured brightnesses were 390 and 400 for the modules in the first row (group) and 280 and 300 $Cd/m^2$ for the modules in the second row (group).) In addition, there was no perceivable modulation to the human observer in light output due to the non-DC power input. The current and voltage waveforms during operation were measured and are shown in FIG. 25. One can see that current flows during both half-cycles of the AC power due to the fact that the two series groups are connected with opposite polarity. This is clarified in FIG. 26 where the current traveling through each group is separately measured. One can see that each group exhibits significant current during only one of the two half-cycles.

Other embodiments of the invention will be apparent to those skilled in the art from a consideration of the embodiments disclosed herein. It is intended that the specification and examples be considered as exemplary only, with the scope and spirit of the invention being defined by the following claims.

What is claimed is:

1. A method of making a light emitting device comprising:
   providing a substrate;
   forming a first conducting material over the substrate;
   forming an organic light emitting material over at least part of the first conducting material;
   forming a second conducting material over at least part of the organic light emitting material; and
   patterning the first conducting material, organic light emitting material, and second conducting material to form a plurality of organic light emitting diode (OLED) modules, each OLED module being disposed on said substrate, each OLED module further having a first electrode formed from the patterned first conducting material, a light emitting layer formed from the organic light emitting material, and a second electrode formed from the patterned second conducting material, the first and second electrodes of respective OLED modules electrically connected to electrically connect the OLED modules in series.

2. The method of claim 1, wherein the first conducting material comprises a conducting material which is transparent to light emitted by the light emitting device.

3. The method of claim 2, wherein the first conducting material comprises indium tin oxide.

4. The method of claim 1, wherein the forming the first conducting material comprises:
   forming a first conducting electrode material; and
   forming a first conducting interconnect material.

5. The method of claim 4, wherein the patterning the first conducting material comprises:
   patterning the first conducting electrode material to form the first electrodes; and
   patterning the first conducting interconnect material to form respective interconnects electrically connected to the respective first electrodes.

6. The method of claim 4 wherein the patterning the second conducting material forms respective second electrodes electrically connected to respective interconnects.

7. The method of claim 4, wherein the forming the first conducting interconnect material comprises:
   sputtering the first conducting interconnect material.

8. The method of claim 1, wherein the forming the first conducting material comprises sputtering at least part of the first conducting material.

9. The method of claim 1, wherein the patterning the first conducting material comprises etching the first conducting material.

10. The method of claim 1, wherein the forming and patterning the first conducting material comprises:
    selectively depositing the first electrode material.

11. The method of claim 1, wherein the first conducting material is a single material.

12. The method of claim 1, wherein the forming and patterning the organic light emitting material comprises:
    evaporating the organic light emitting material through a shadow mask.

13. The method of claim 1, wherein the forming and patterning the organic light emitting material comprises:
    depositing the organic light emitting material over the substrate; and
    etching the deposited organic light emitting material to form the light emitting layer.

14. The method of claim 1, wherein the forming and patterning the organic light emitting material comprises:
    selectively depositing the organic light emitting material over the substrate to form the light emitting layer.

15. The method of claim 1, wherein the forming and patterning the second conducting material comprises:
    evaporating the second conducting material through a shadow mask.

16. The method of claim 1, wherein the forming and patterning the second conducting material comprises:
    depositing the second conducting material over the substrate; and
    etching the deposited second conducting material.

17. The method of claim 1, wherein the step of forming the first conducting material comprises:
    forming a first electrode component; and
    forming a first interconnect component.

18. The method of claim 17, wherein forming the first electrode component and forming the first interconnect component are performed in a single patterning step.

19. A method of making a light emitting device comprising:
    providing a substrate;
    forming a first conducting material over the substrate;

forming an organic light emitting material over at least part of the first conducting material;
forming a second conducting material over at least part of the organic light emitting material; and
forming a plurality of organic light emitting diode (OLED) series groups on the substrate, each OLED series group comprising a plurality of OLED modules, the OLED modules of each OLED series group electrically connected in series, wherein each OLED series group is disposed on the substrate and wherein the OLED modules emit light upon application of an AC voltage.

* * * * *